United States Patent [19]
Shimizu et al.

[11] Patent Number: 5,946,230
[45] Date of Patent: Aug. 31, 1999

[54] NONVOLATILE SEMICONDUCTOR MEMORY DEVICE HAVING THE RELIABILITY OF GATE INSULATING FILM OF MEMORY CELLS ENHANCED AND METHOD FOR MANUFACTURING THE SAME

[75] Inventors: Kazuhiro Shimizu; Seiichi Aritome, both of Yokohama; Shinji Satoh, Fujisawa, all of Japan

[73] Assignee: Kabushiki Kaisha Toshiba, Tokyo, Japan

[21] Appl. No.: 09/156,787

[22] Filed: Sep. 17, 1998

[30] Foreign Application Priority Data

Sep. 19, 1997 [JP] Japan .................................. 9-255048

[51] Int. Cl.$^6$ ................................................ G11C 16/04
[52] U.S. Cl. .................. 365/185.01; 365/182; 365/149; 257/314; 257/315; 257/321
[58] Field of Search ............................. 365/185.01, 149, 365/182; 257/314, 315, 321, 410

[56] References Cited

U.S. PATENT DOCUMENTS 4,612,629  9/1986  Harari ................................. 365/185.08

FOREIGN PATENT DOCUMENTS 4230077  8/1992  Japan .

OTHER PUBLICATIONS

Aritome, et al. "A 0.67um$^2$ Self–Aligned Shallow Trench Isolation Cell (SA–STI Cell) For 3V–only 256 Mbit NAND EEPROMs," IEEE (IEDM) 1994, ISBN 0-7803-2111-1, pp. 94-61 to 94-64.

*Primary Examiner*—David Nelms
*Assistant Examiner*—David Lam
*Attorney, Agent, or Firm*—Loeb & Loeb LLP

[57] ABSTRACT

An EEPROM includes a memory cell array section and a peripheral driving circuit section. The memory cell array section has memory cells which are arranged in a matrix form on a silicon substrate and each of which includes a floating gate coupled to the silicon substrate via a first capacitor having a first gate insulating film as a dielectric and a control gate coupled to the floating gate via a second capacitor having a second gate insulating film as a dielectric. In the outmost portion of the memory cell array section, memory cells of a first group are arranged and memory cells of a second group are arranged in the central portion on the inner side of the memory cell array section. The first gate insulating film of the first group of memory cells is thicker than the first gate insulating film of the second group of memory cells. The peripheral driving circuit section is formed adjacent to the memory cell array section on the silicon substrate. The circuit section is to activate the storage function of the memory cell array section and includes a row decoder, sense amplifier circuit, source line potential control circuit and the like.

17 Claims, 20 Drawing Sheets

NONVOLATILE SEMICONDUCTOR MEMORY DEVICE HAVING THE RELIABILITY OF GATE INSULATING FILM OF MEMORY CELLS ENHANCED AND METHOD FOR MANUFACTURING THE SAME

BACKGROUND OF THE INVENTION

This invention relates to a nonvolatile semiconductor memory device and a method for manufacturing the same, and more particularly to enhancement of the reliability of a gate insulating film of memory cells.

An EEPROM is a type of nonvolatile memory capable of electrically rewriting data and has a memory cell array in which memory cells for storing data are integrated. As the memory cell in the EEPROM, a MOSFET of a stacked gate structure having a floating gate and a control gate stacked is widely known.

FIG. 1A is a pattern plan view showing part of a memory cell array in which MOSFETs (memory cells) of the stacked gate structure are integrated, and FIG. 1B is a cross sectional view taken along the line 1B—1B of the pattern shown in FIG. 1A. As shown in FIGS. 1A and 1B, element isolation regions 102 are formed to separate active regions 104 from one another on the main surface of a p-type silicon substrate (or p-type well) 101. Under each of the insulating films 102, a $P^+$-type diffused layer 103 having higher impurity concentration than the substrate 101 is formed. The $P^+$-type diffused layer 103 is a channel stopper. On each of the active regions 104, a first thin gate insulating film 105 in which a tunnel current can flow is formed and a floating gate 106 is formed thereon. On each of the floating gates 106, a second gate insulating film 107 is formed and a control gate 108 is formed thereon. Thus, the gate of the memory cell is formed in the form of stacked gate structure in which the floating gate 106 and the control gate 108 are stacked. The floating gate 106 and the control gate 108 are formed by continuously effecting the etching process by use of the same mask and the edges of the stacked gate structures arranged on the row are aligned.

Source regions 109S and drain regions 109D are formed by ion-implanting n-type impurity into the active regions 104 by using the stacked gate structures and element isolation regions 102 as a mask. The end portion of the floating gate 106 is formed to extend on the element isolation region 102 and constructs a portion which is generally called a wing 110. The wing 110 functions to enlarge the opposed areas of the control gate 108 and the floating gate 106 so as to increase the capacitance between the control gate 108 and the floating gate 106.

An inter-level insulating film 150 is formed on the entire surface of the resultant semiconductor structure. On the inter-level insulating film 150, bit lines 151 are formed. The bit lines 151 are selectively connected to the drain regions 109D via bit line contact holes 152 formed in the inter-level insulating film 150. In FIG. 1A, only the positions of the bit line contact holes 152 are shown and the inter-level insulating film 150 and the bit lines 151 are omitted.

As the element isolation region 102 shown in FIGS. 1A and 1B, a LOCOS type film formed by thermally oxidizing a selected part of the main surface of the substrate 101 is widely used. In the LOCOS method, the main surface of the substrate 101 is thermally oxidized after a portion of the substrate 101 in which the active regions are formed is covered with an oxidation resistant film such as a silicon nitride film ($Si_3N_4$). Since the silicon nitride film acts as a barrier against oxidation, a thick thermal oxidation film can locally be formed on a portion of the substrate 101 on which the element isolation regions are formed.

Recently, a trench element isolation method for forming trenches in a portion of the substrate 101 on which the element isolation regions are formed and filling insulator in the trenches becomes popular as the technique for making the dimensions of the element isolation region 102 smaller than the LOCOS type.

FIG. 2 is a cross sectional view showing part of a memory cell array in an EEPROM formed by use of the trench element isolation method. For example, the cross section of FIG. 2 corresponds to the portion taken along the line 1B—1B of FIG. 1A. In FIG. 2, portions which are the same as those of FIG. 1B are denoted by the same reference numerals. As shown in FIG. 2, in the trench type, trenches 111 are formed in a portion of the substrate 101 on which the element isolation regions are formed and the inner portion of the trench 111 is filled with insulator 112.

With the above trench type, since the element isolation region can be formed deeply into the substrate 101, the effective element isolation distance can be made larger than in the LOCOS type. Therefore, if the element isolation width is the same, the element isolation ability can be extremely enhanced in comparison with the LOCOS type.

Further, a self-aligned trench element isolation method capable of further reducing the isolation distance in the row direction in comparison with the trench type for element isolation in the memory cell array of the EEPROM is also known. The self-aligned trench element isolation method is disclosed in IEDM 94 pp. 61–64 "A 0.67 $\mu m^2$ SELF-ALIGNED SHALLOW TRENCH ISOLATION CELL (SA-STI (CELL) FOR 3V-only 256 Mbit NAND EEPROMs" S. Aritome et al., for example.

FIG. 3 is a cross sectional view showing part of a memory cell array in the EEPROM formed by use of the self-aligned trench element isolation method. The cross section shown in FIG. 3 corresponds to the portion taken along the line 1B—1B of FIG. 1A, for example. In FIG. 3, portions which are the same as those of FIG. 1B are denoted by the same reference numerals. As shown in FIG. 3, in the self-aligned trench type, wings 110 are formed in a direction perpendicular to the substrate 101 on the boundaries between active regions 104 and trenches 111. Therefore, the integration density can be enhanced in comparison with the LOCOS type and trench type in which the wing 110 is enlarged in the row direction.

FIG. 4 is a block diagram showing the basic construction of a conventional EEPROM. In FIG. 4, only a typical circuit block which lies around a memory cell array section 201 is extracted and shown. Generally, the EEPROM contains the memory cell array section 201 for storing data and a peripheral driving circuit section 202 for driving the array section 201 and activating the storage function thereof. The circuit section 202 includes a row decoder section 301, sense amplifier circuit section 302, column decoder section 303 and booster circuit section 304. The row-decoder section 301 is connected to word lines WL in the memory cell array section 201 to selectively activate the word line WL. The sense amplifier circuit section 302 is connected to bit lines BL in the memory cell array section 201 and amplifies and latches read data from a memory cell MC or program data into the memory cell MC. The column decoder section 303 is connected to the bit lines BL in the sense amplifier circuit section 302 to selectively activate the bit line BL. The booster circuit section 304 raises a given voltage to create a desired internal voltage and supplies the same to the row decoder section 301, for example.

For element isolation of the array section 201 and circuit section 202, one of the above three element isolation techniques can be used or different element isolation techniques can be used for them. Particularly, in the array section 201 which requires miniaturization, the trench element isolation or self-aligned trench element isolation becomes extremely effective if the minimum dimension becomes 0.4 μm or less. In contrast, in the circuit section 202, the element isolation distance and transistors are larger than in the array section 201. This is because a program voltage (for example, 20V) is applied to the PN junction and the contact area and gate length are larger than in the memory cell MC due to the structure of the transistor, for example. Because of the process margin and integration, the LOCOS element isolation which can be a more stably established technique than the trench element isolation may be suitably used in the circuit section 202 in some cases. In such a case, the trench element isolation or self-aligned trench element isolation is used in the array section 201 and the LOCOS element isolation is used in the circuit section 202.

FIG. 5 is a circuit diagram showing the array section 201 and peripheral driving circuit section 202 in the NAND type EEPROM, and more particularly, the connecting portion with the row decoder section 301 in a simplified form. As shown in FIG. 5, each of the word lines WL (WL1 to WLn) and selection gate lines SG (SG1, SG2) is connected to a corresponding one of high breakdown voltage transistors HVTr contained in the row decoder section 301. In the program mode, a voltage equal to or higher than "the program voltage+the threshold voltage of the transistor HVTr" is applied to the gate of the transistor HVTr to turn ON the transistor HVTr. As a result, the program voltage (for example, 20V) is transferred to the word line selected for programming via the drain-source path of the transistor HVTr. In FIG. 5, the positions of contact holes 153, 155 are shown in the circuit diagram as equivalent positions. The source region of the transistor HVTr is connected to the word line WL or the source region thereof is connected to the selection gate line SG by means of a metal wiring 154 via the contact holes 153, 155.

FIG. 6 is a cross sectional view of part of the circuit shown in FIG. 5. In FIG. 6, the LOCOS element isolation is used for both of the array section 201 and the row decoder section 301 or circuit section 202. As shown in FIG. 6, the control gate 108 is formed to extend from the upper portion of the active region 104 in the array section 201 to the upper portion of the element isolation insulating film 102 in the peripheral driving circuit section 202. In this portion, the control gate 108 is connected to the metal wiring 154 via the contact hole 153 and connected to the transistor HVTr in the row decoder section 301 shown in FIG. 5.

The element isolation region 102 in the array section 201 is formed of a thin line pattern extending in a direction crossing the control gate (word line) 108 and repeated with periodicity. In contrast, in the element isolation region 102 in the circuit section 202, there is no periodicity in which the thin line pattern is repeated. For this reason, the periodicity of the pattern is disturbed on the element isolation region 102 corresponding to the boundary between the array section 201 and the circuit section 202. This makes it difficult to process the floating gates 106 with the same dimension in the outermost portion of the array section 201 and in the internal portion thereof at the time of lithography, for example. In order to eliminate the disturbance of the periodicity, for example, several dummy patterns are formed in the outermost portion of the array section 201. However, since the outermost portion of the array section 201 is formed in contact with the element isolation region 102 of the circuit section 202, the pattern of the floating gate 106 becomes different from the pattern of the floating gate 106 lying inside the array section 201 as shown in FIG. 6.

As described above, the pattern of the floating gate 106 in the outermost portion is different from the pattern of the floating gate inside the memory cell array section 201. For this reason, the capacitance between the floating gate 106 and the control gate 108 is different for a cell in the dummy pattern lying in the outermost portion and for a cell in the normal pattern lying inside the above cell and actually used as a cell.

FIG. 7A is an equivalent circuit diagram of a memory cell in the EEPROM and FIG. 7B is a perspective view for illustrating the dimensions of a dummy pattern cell and the dimensions of a normal cell (which is hereinafter referred to as a memory cell). As shown in FIG. 7A, the memory cell can be replaced by a circuit having capacitors C1 and C2 serially connected between the substrate 101 and the control gate 108. The electrode which is commonly used by the capacitors C1 and C2 corresponds to the floating gate 106. In the above equivalent circuit, the capacitor C1 is a capacitor between the substrate 101 and the floating gate 106 and the capacitor C2 is a capacitor between the floating gate 106 and the control gate 108. Further, the dielectric of the capacitor C1 is the first gate insulating film 105 between the substrate 101 and the floating gate 106 and the dielectric of the capacitor C2 is the second gate insulating film 107 between the floating gate 106 and the control gate 108.

When a potential VCG is applied to the control gate 108 shown in FIG. 7A, a potential VFG of the floating gate 106 is expressed by the following equation (1).

$$VFG = \frac{C2}{C1+C2} \cdot VCG \quad (1)$$

When the film thickness of the dielectric of the capacitor C1 is T, the electric field E applied to the dielectric is expressed by the following equation (2).

$$E = \frac{VFG}{T} \quad (2)$$

It is understood from the equation (1) that the potentials VFG of the floating gates 106 of the dummy pattern cell and the memory cell are different from each other if the capacitances C2 are different when the same potential VCG is applied to the control gates 108 of the dummy pattern cell and the memory cell.

Further, it is understood from the equation (2) that the electric fields applied to the dielectrics of the capacitors C1, that is, the first gate insulating films 105 are different from each other if the potential of the floating gate 106 of the dummy pattern cell and the potential of the floating gate 106 of the memory cell are different from each other.

This is more specifically explained with reference to FIG. 7B. In FIG. 7B, Wd, Wc are the widths of the active regions 104 of the dummy pattern cell and the memory cell, Ww is the width of the wing 110, l indicates the length of extension of the floating gate 106 on the element isolation region 102 in the peripheral driving circuit section 202, and L indicates the channel length of the dummy pattern cell and memory cell.

The dielectric constants of the first gate insulating film 105 and second gate insulating film 107 are respectively set to $\epsilon1$ and $\epsilon2$, the film thicknesses of the first gate insulating films 105 of the dummy pattern cell and the memory cell are respectively set to Td and Tc, and the film thicknesses of the second gate insulating films 107 of the dummy pattern cell and the memory cell are set to T2. Further, $\epsilon0$ is the dielectric constant of vacuum.

In the thus set condition, the capacitance C1 of the memory cell is expressed by the following equation (3).

$$C1 = \frac{\varepsilon1 \cdot \varepsilon0 \cdot Wc \cdot L}{Tc} \quad (3)$$

The capacitance C2 of the memory cell is expressed by the following equation (4).

$$C2 = \frac{\varepsilon2 \cdot \varepsilon0 \cdot (Wc + 2Ww) \cdot L}{T2} \quad (4)$$

From the equations (1), (3) and (4), the potential VFG of the floating gate 106 of the memory cell when the potential VCG is applied to the control gate 108 is expressed by the following equation (5).

$$VFG = \frac{\frac{\varepsilon2 \cdot \varepsilon0 \cdot (Wc + 2Ww) \cdot L}{T2}}{\frac{\varepsilon1 \cdot \varepsilon0 \cdot Wc \cdot L}{Tc} + \frac{\varepsilon2 \cdot \varepsilon0 \cdot (Wc + 2Ww) \cdot L}{T2}} \cdot VCG$$

$$= \frac{VCG}{1 + \frac{\varepsilon1 \cdot Wc}{\varepsilon2(Wc + 2Ww)} \cdot \frac{T2}{Tc}} \quad (5)$$

Further, the capacitance C1 of the dummy pattern cell is expressed as follows.

$$C1 = \frac{\varepsilon1 \cdot \varepsilon0 \cdot Wd \cdot L}{Td} \quad (6)$$

The capacitance C2 of the dummy pattern cell is expressed as follows.

$$C2 = \frac{\varepsilon2 \cdot \varepsilon0 \cdot (Wd + l + Ww) \cdot L}{T2} \quad (7)$$

From the equations (1), (6) and (7), the potential VFG of the floating gate 106 of the dummy pattern cell when the potential VCG is applied to the control gate 108 is expressed by the following equation (8).

$$VFG = \frac{\frac{\varepsilon2 \cdot \varepsilon0 \cdot (Wd + l + Ww) \cdot L}{T2}}{\frac{\varepsilon1 \cdot \varepsilon0 \cdot Wd \cdot L}{Td} + \frac{\varepsilon2 \cdot \varepsilon0 \cdot (Wd + l + Ww) \cdot L}{T2}} \cdot VCG$$

$$= \frac{VCG}{1 + \frac{\varepsilon1 \cdot Wd}{\varepsilon2(Wd + Ww + l)} \cdot \frac{T2}{Td}} \quad (8)$$

Further, from the equations (2) and (5), the electric field Ec applied to the first gate insulating film 105 of the memory cell is expressed by the following equation (9).

$$Ec = \frac{VFG}{Tc} = \frac{\frac{VCG}{Tc}}{1 + \frac{\varepsilon1 \cdot Wc}{\varepsilon2(Wc + 2Ww)} \cdot \frac{T2}{Tc}}$$

$$= \frac{VCG}{Tc + \frac{\varepsilon1 \cdot Wc}{\varepsilon2(Wc + 2Ww)} \cdot T2} \quad (9)$$

Further, from the equations (2) and (8), the electric field Ed applied to the first gate insulating film 105 of the dummy pattern cell is expressed by the following equation (10).

$$Ed = \frac{VFG}{Td} = \frac{\frac{VCG}{Td}}{1 + \frac{\varepsilon1 \cdot Wd}{\varepsilon2(Wd + Ww + l)} \cdot \frac{T2}{Td}}$$

$$= \frac{VCG}{Td + \frac{\varepsilon1 \cdot Wd}{\varepsilon2(Wd + Ww + l)} \cdot T2} \quad (10)$$

It is understood from the equations (9) and (10) that the electric field Ed applied to the first gate insulating film 105 in the dummy pattern cell may be different from the electric field Ec in the memory cell in some cases.

That is, if a portion of the floating gate 106 of the dummy pattern cell which extends on the element isolation region 102 in the circuit section 102 is wide, the degree of coupling between the control gate 108 and the floating gate 106 of the dummy pattern cell becomes high and the electric field Ed becomes stronger than the electric field Ec. In contrast, if the extending portion is narrow, the electric field applied to the second gate insulating film 107 becomes stronger as the electric field Ed becomes weaker.

From the equations (9) and (10), the ratio of the electric field Ed to the electric field Ec is expressed by the following equation (11).

$$Ed/Ec = \frac{Tc + \frac{\varepsilon1 \cdot Wc}{\varepsilon2(Wc + 2Ww)} \cdot T2}{Td + \frac{\varepsilon1 \cdot Wd}{\varepsilon2(Wd + Ww + l)} \cdot T2} \quad (11)$$

From the equation (11), it is understood that the dummy pattern cell and the memory cell may be formed with the same dimensions in order to set the electric fields Ed and Ec to the same value. However, as described above, it is difficult to form the pattern in the outermost portion and the inner pattern with the same dimensions under circumstances of lithography, and the dimensions of the floating gate 106 of the dummy pattern cell will be larger than the floating gate 106 of the memory cell.

The first gate insulating film 105 is a portion via which electrons pass at the time of programming and erasing and the film thickness thereof is set to an optimum value according to the memory cell. Therefore, in the first gate insulating film 105 of the dummy pattern cell to which the electric field Ed higher than the electric field Ec is applied, the reliability with respect to the withstand voltage, for example, is lowered in comparison with the first gate insulating film 105 of the memory cell. If the insulating characteristic of the first gate insulating film 105 of the dummy pattern cell is lowered, the electric field applied to the second gate insulating film 107 becomes larger and the insulating characteristic of the second gate insulating film 107 starts to be lowered. In due course of time, the insulating characteristics of both of the first gate insulating film 105 and second gate insulating film 107 are deteriorated and the insulating property between the control gate and the substrate 101 will be lost. As a result, a phenomenon which deteriorates the characteristic of the memory cell occurs and, for example, the potential of the control gate 108 will not be raised to a sufficiently high level. Further, if dielectric breakdown occurs in the second gate insulating film 107 at the time of application of a high voltage for programming, for example, the first gate insulating film is also destroyed and the memory cell becomes defective.

Such a problem caused by a difference in the pattern of the floating gate 106 in the outermost portion will occur even if the trench isolation is used for both of the array section 201 and the circuit section 202 as shown in FIG. 8 or even if the trench element isolation is used for the array section 201 and the LOCOS element isolation is used for the peripheral driving circuit section 202 as shown in FIG. 9.

Further, in a case where the self-aligned trench element isolation is used for both of the array section 201 and the peripheral driving circuit section 202 as shown in FIG. 10, the capacitance C2 of the outermost dummy pattern cell becomes smaller than the capacitance C2 of the memory cell. For this reason, the electric field applied to the second gate insulating film 107 of the dummy pattern cell becomes stronger to lower the insulating characteristic of the second gate insulating film 107, and consequently, the electric field applied to the first gate insulating film 105 becomes stronger to lower the insulating characteristic of the first gate insulating film 105. As a result, like the above-described case, the characteristic of the memory cell is deteriorated and the memory cell becomes defective.

Further, in a case where the self-aligned trench element isolation is used for the array section 201 and the LOCOS element isolation is used for the peripheral driving circuit section 202 as shown in FIG. 11, the capacitance C2 of the outermost dummy pattern cell becomes larger than the capacitance C2 of the memory cell so that the insulating characteristic of the first gate insulating film 105 will be lowered, and consequently, the electric field applied to the second gate insulating film 107 will become stronger to lower the insulating characteristic of the second gate insulating film 107 and thus the characteristic of the memory cell is deteriorated.

As described above, in the conventional nonvolatile semiconductor memory device, since the pattern of the cells in the outermost portion of the memory cell array section and the pattern of the cells lying inside the above pattern are different from each other, the insulating characteristic between the control gate and the substrate is deteriorated, and as a result, there occurs a problem that the characteristic of the memory cell is deteriorated and the memory cell becomes defective.

BRIEF SUMMARY OF THE INVENTION

Accordingly, a first object of this invention is to provide a nonvolatile semiconductor memory device capable of suppressing deterioration in the insulating characteristic between the control gate and the substrate and enhancing the reliability of the memory cells even if the pattern of the cells in the outermost portion of the memory cell array section and the pattern of cells lying inside the cell pattern of the outermost portion are different from each other.

Further, a second object of this invention is to provide a method for manufacturing a nonvolatile semiconductor memory device capable of suppressing deterioration in the insulating characteristic between the control gate and the substrate and enhancing the reliability of the memory cells even if the pattern of the cells in the outermost portion of the memory cell array section and the pattern of cells lying inside the cell pattern of the outermost portion are different from each other.

The first object of this invention can be attained by a nonvolatile semiconductor memory device comprising a memory cell array section having memory cells which are arranged in a matrix form on a semiconductor substrate and each of which includes a charge storage layer coupled to the semiconductor substrate via a first capacitor having a first gate insulating film as a dielectric and a gate coupled to the charge storage layer via a second capacitor having a second gate insulating film as a dielectric, the memory cells including a first group of memory cells arranged in the outermost portion of the memory cell array section and a second group of memory cells arranged on the central side of the memory cell array section with respect to the first group of memory cells; wherein the second capacitors of the first group of memory cells have different capacitances from the second capacitors of the second group of memory cells and the first gate insulating film of the first group of memory cells is formed thicker than the first gate insulating film of the second group of memory cells.

With the above construction, since the first gate insulating film of the first group of memory cells is formed thicker than the first gate insulating film of the second group of memory cells, a lowering in the insulating characteristic between the gate and the substrate can be suppressed and the reliability of the memory cells can be enhanced even if the pattern of the first group of memory cells arranged in the outermost portion of the memory cell array section and the pattern of the second group of memory cells arranged on the inner side with respect to the pattern of the memory cells in the outermost portion are different from each other.

Further, the first object of this invention described above can be attained by a nonvolatile semiconductor memory device comprising a memory cell array section having memory cells which are arranged in a matrix form on a semiconductor substrate and each of which includes a charge storage layer coupled to the semiconductor substrate via a first capacitor having a first gate insulating film as a dielectric and a gate coupled to the charge storage layer via a second capacitor having a second gate insulating film as a dielectric, the memory cells being arranged in substantially parallel linear active regions which are defined by a first element isolation region formed in the memory cell array section, and the memory cells including a first group of memory cells arranged in the outermost portion of the memory cell array section and a second group of memory cells arranged on the central side of the memory cell array section with respect to the first group of memory cells; and a peripheral driving circuit section provided adjacent to the memory cell array section, for driving the memory cell array section; wherein the following expression is satisfied:

$$1 \geq Ed/Ec = \frac{Tc + \dfrac{\varepsilon 1 \cdot Wc}{\varepsilon 2(Wc + 2Ww)} \cdot T2}{Td + \dfrac{\varepsilon 1 \cdot Wd}{\varepsilon 2(Wd + Ww + l)} \cdot T2}$$

when an electric field applied to the first gate insulating film of the first group of memory cells is Ed, an electric field applied to the first gate insulating film of the second group of memory cells is Ec, the film thickness of the first gate insulating film of the first group of memory cells is Td, the thickness of the first gate insulating film of the second group of memory cells is Tc, the thickness of the second gate insulating film of the first and second groups of memory cells is T2, the dielectric constant of the first gate insulating film of the first and second groups of memory cells is $\epsilon 1$, the dielectric constant of the second gate insulating film of the first and second groups of memory cells is $\epsilon 2$, the width of the active region of the first group of memory cells is Wd, the width of the active region of the second group of memory cells is Wc, the width of a wing of the charge storage layer extending on the first element isolation region of the memory cell array section is Ww, and the length of a portion of the charge storage layer extending on a second element isolation region in the peripheral driving circuit section is l.

With the above construction, since the electric field applied to the first gate insulating film of the first group of memory cells is made weaker than the electric field applied to the first gate insulating film of the second group of memory cells, a lowering in the insulating characteristic between the gate and the substrate can be suppressed and the reliability of the memory cells can be enhanced even if the pattern of the first group of memory cells arranged in the outermost portion of the memory cell array section and the pattern of the second group of memory cells arranged on the inner side with respect to the pattern of the memory cells in the outermost portion are different from each other.

The second object of this invention can be attained by a method for manufacturing a nonvolatile semiconductor memory device comprising the steps of forming an element isolation region in a semiconductor substrate, for defining a memory cell array section on the semiconductor substrate and linear active regions substantially in parallel to one another in the memory cell array section; forming a first insulating film on each of the active regions; removing the first insulating film from the active regions except the active regions arranged in at least the outermost portion of the memory cell array section; forming a second insulating film thinner than the first insulating film on a portion from which the first insulating film was removed; forming a first conductive film having slits extending in a direction along the active regions above the element isolation region to face the active regions with the first and second insulating films disposed therebetween; forming a third insulating film on the first conductive film; forming a second conductive film to face the first conductive film with the third insulating film disposed therebetween; and patterning the second conductive film, the third insulating film, and the first conductive film to form memory cells each having a stacked gate structure including a control gate formed of the second conductive film and a charge storage layer formed of the first conductive film.

With the above manufacturing method, since the first insulating film of the memory cells arranged in the outermost portion of the memory cell array section and the second insulating film of the memory cell arranged in the central portion of the memory cell array section with respect to the above memory cells are formed in the different steps and the first insulating film is formed thicker than the second insulating film, a lowering in the insulating characteristic between the gate and the substrate can be suppressed and the reliability of the memory cells can be enhanced even if the pattern of the memory cells arranged in the outermost portion of the memory cell array section and the pattern of the memory cells arranged on the inner side with respect to the pattern of the memory cells in the outermost portion are different from each other.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

Figure 1A:
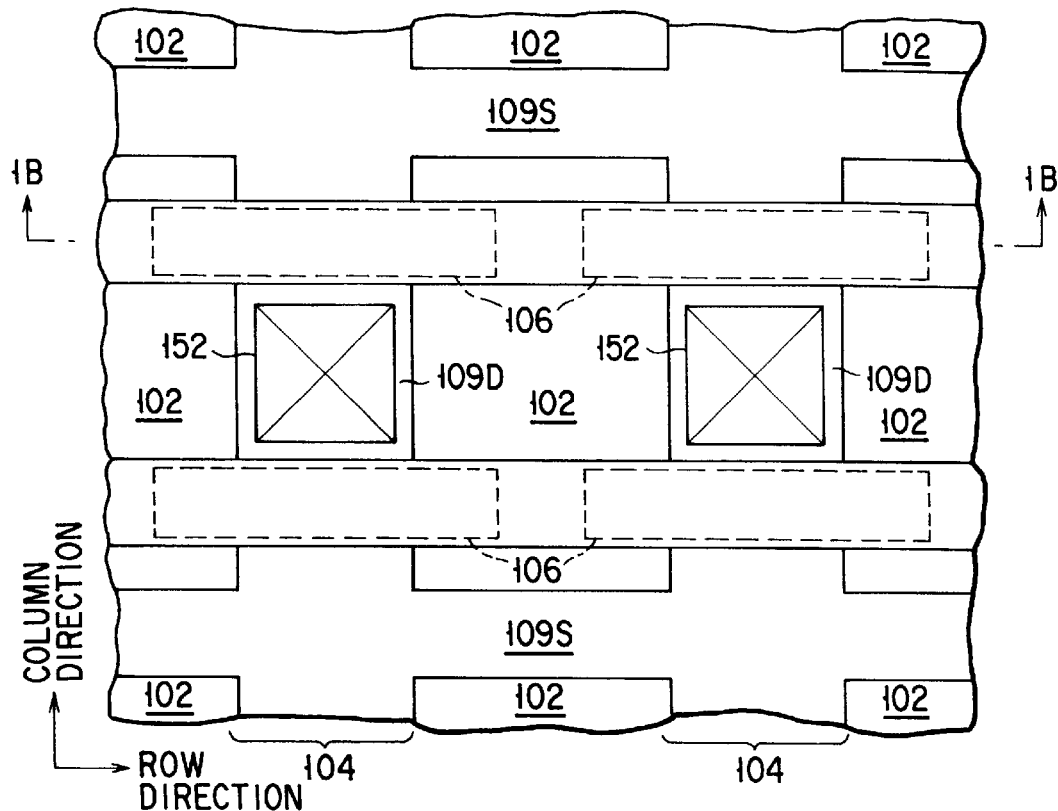
FIG. 1A is a pattern plan view showing part of a memory cell array in an EEPROM, for illustrating a conventional nonvolatile semiconductor memory device.
Figure 1B:
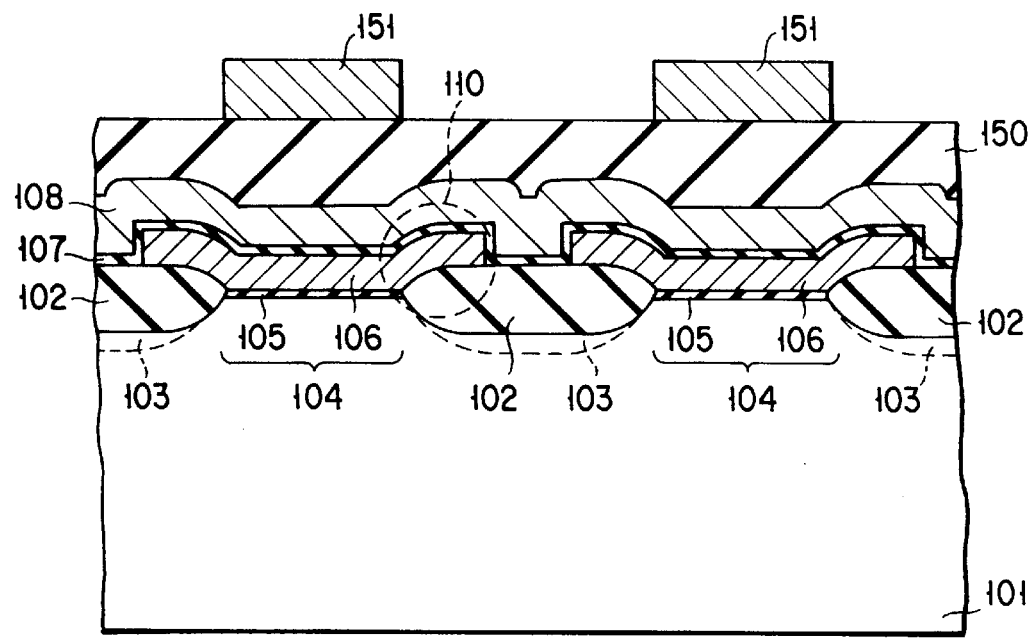
FIG. 1B is a cross sectional view taken along the line 1B—1B of the pattern shown in FIG. 1A.
Figure 2:
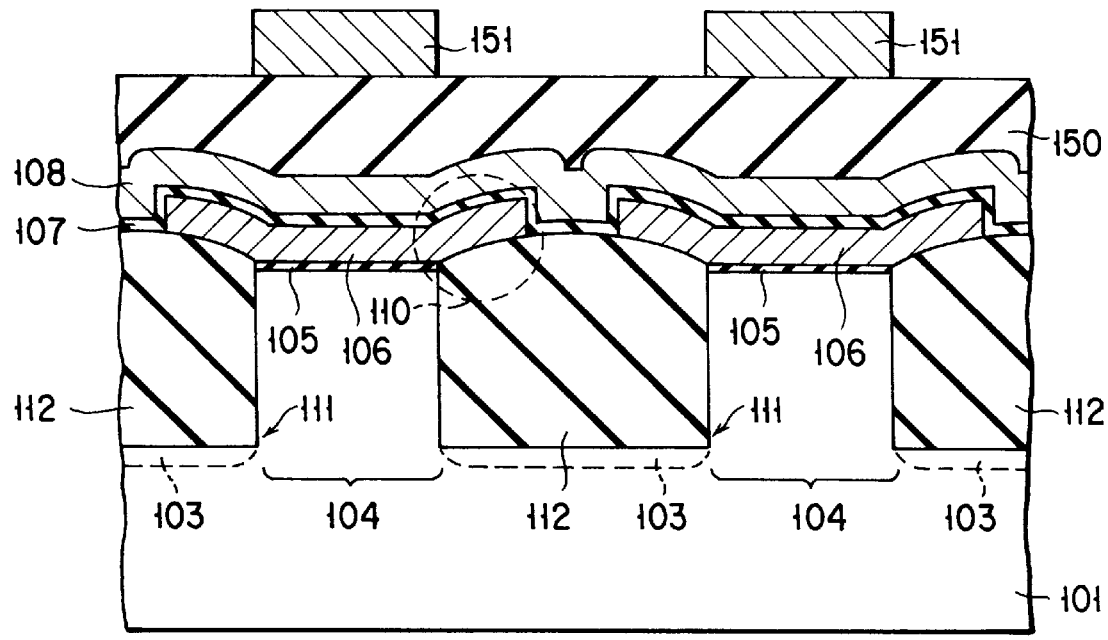
FIG. 2 is a cross sectional view showing part of a memory cell array in an EEPROM formed by use of the trench element isolation method, for illustrating a conventional nonvolatile semiconductor memory device.
Figure 3:
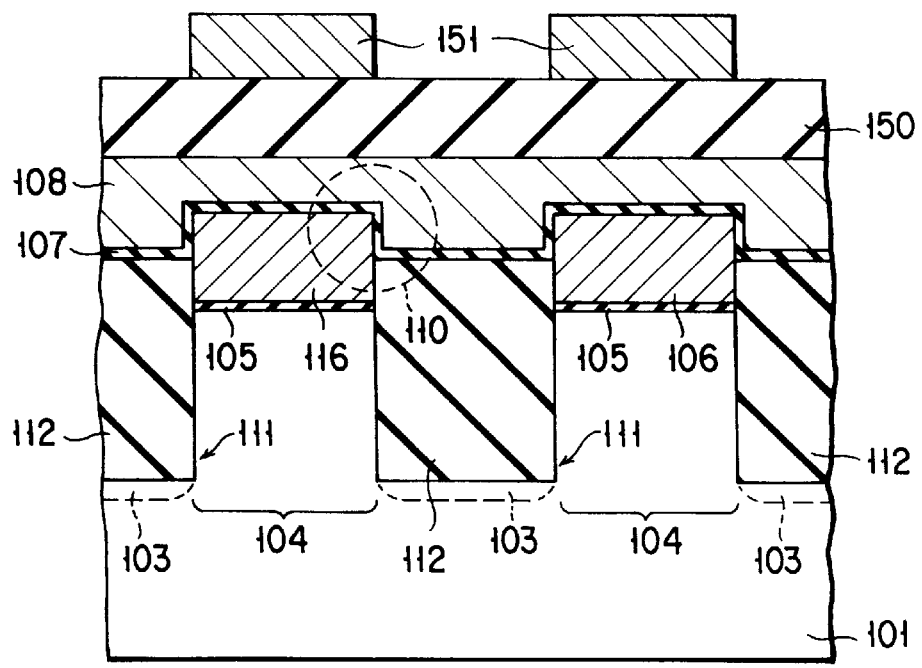
FIG. 3 is a cross sectional view showing part of a memory cell array in an EEPROM formed by use of the self-aligned trench element isolation method, for illustrating a conventional nonvolatile semiconductor memory device.
Figure 4:
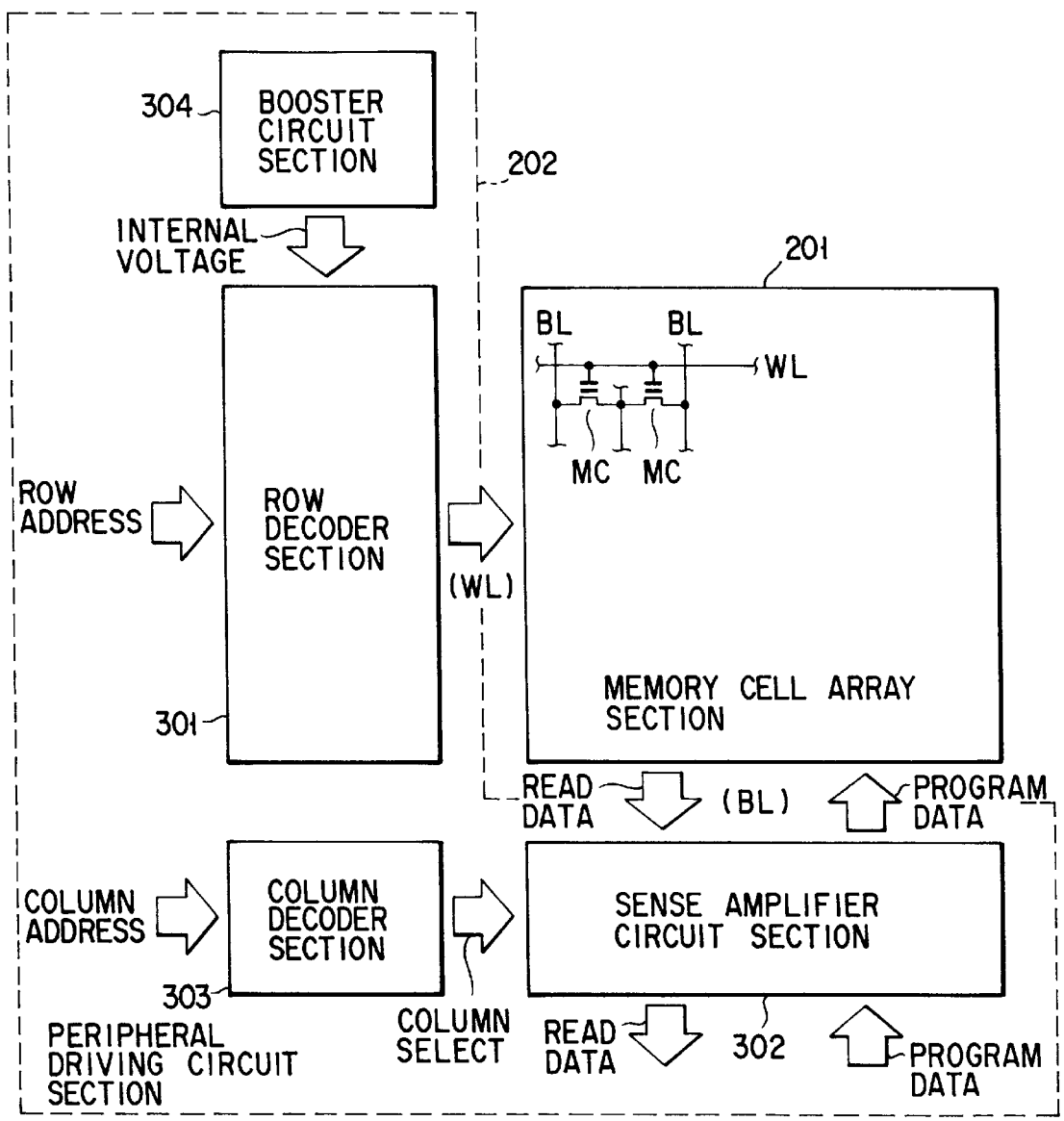
FIG. 4 is a block diagram showing the basic construction of an EEPROM, for illustrating a conventional nonvolatile semiconductor memory device.
Figure 5:
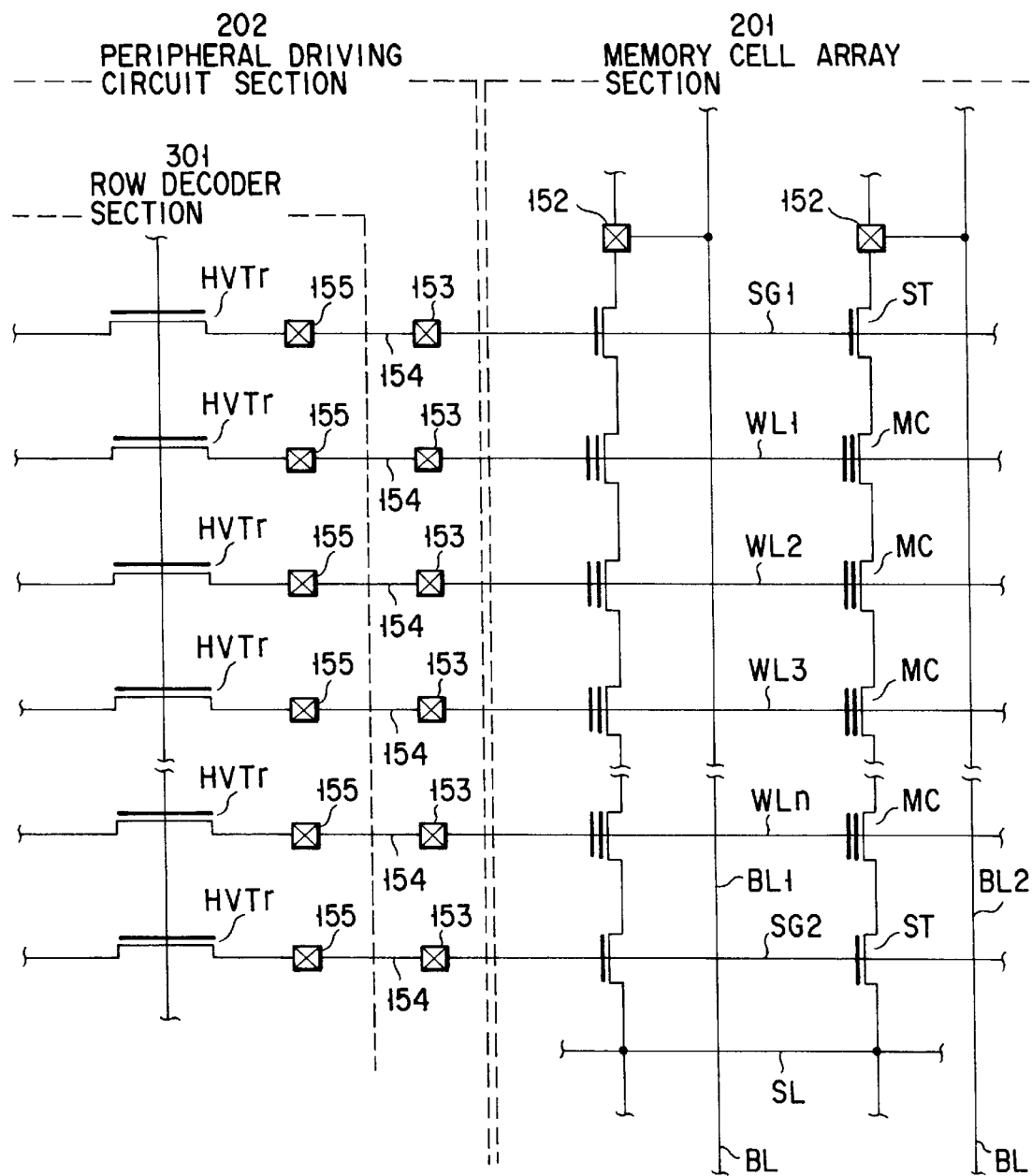
FIG. 5 is a circuit diagram showing the boundary portion between a memory cell array section and a peripheral driving circuit section in a NAND type EEPROM.
Figure 6:
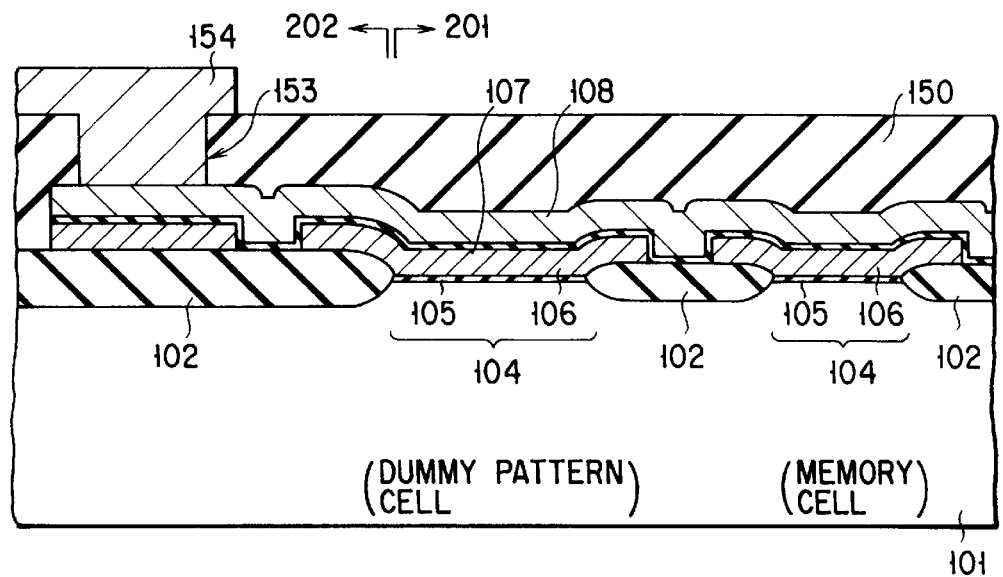
FIG. 6 is a cross sectional view of part of the circuit shown in FIG. 5.
Figure 7A:
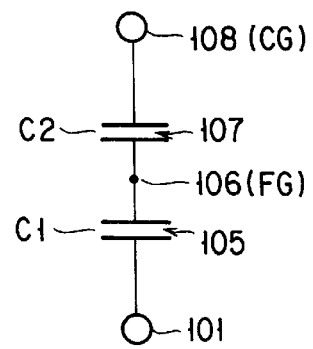
FIG. 7A is an equivalent circuit diagram of a memory cell in the EEPROM.
Figure 7B:
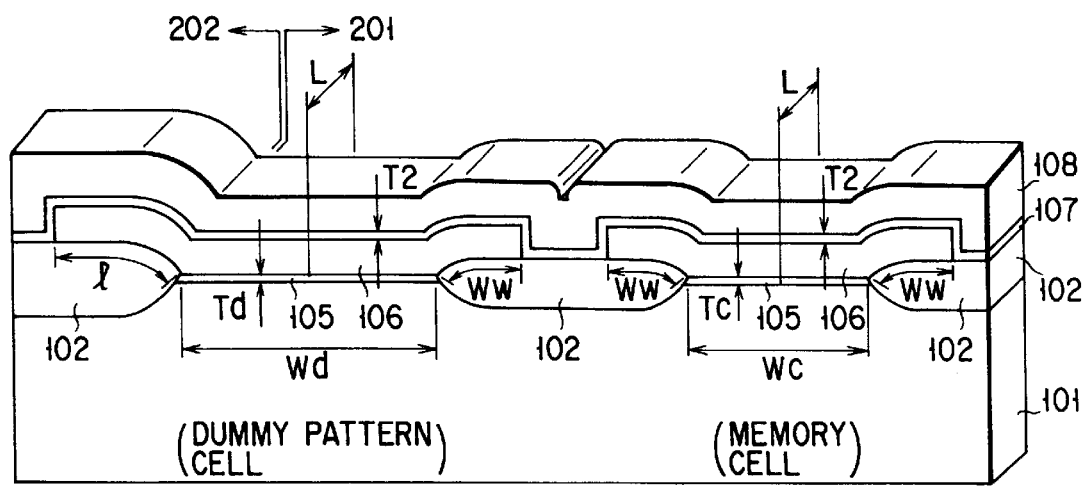
FIG. 7B is a perspective view for illustrating the dimensions of a dummy pattern cell and the dimensions of a normal memory cell.
Figure 8:
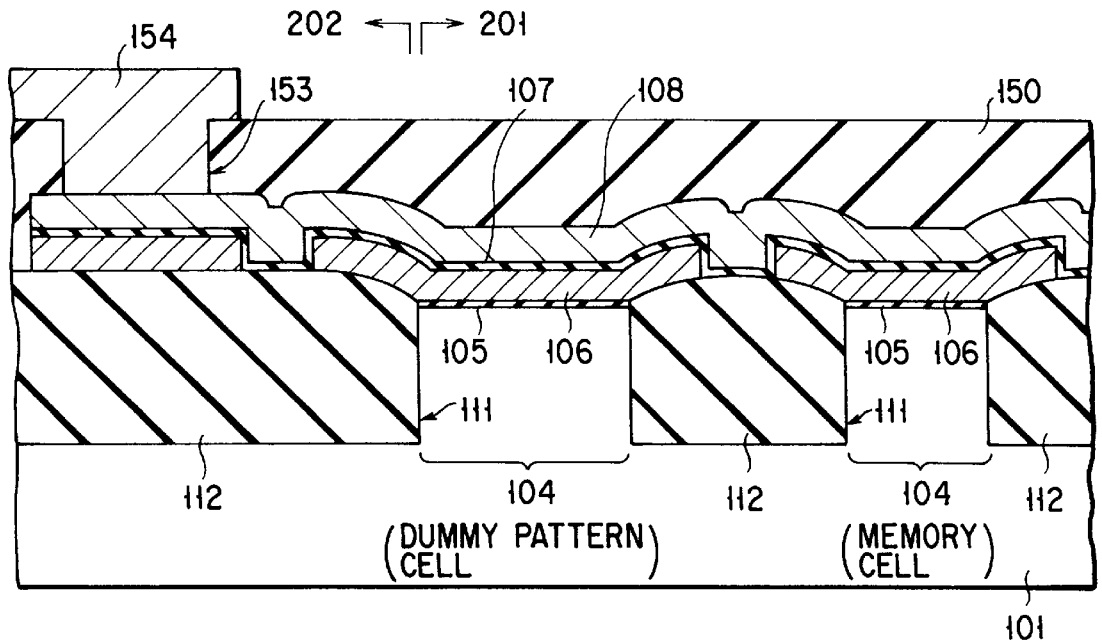
FIG. 8 is a cross sectional view of part of an EEPROM, for illustrating another conventional nonvolatile semiconductor memory device.
Figure 9:
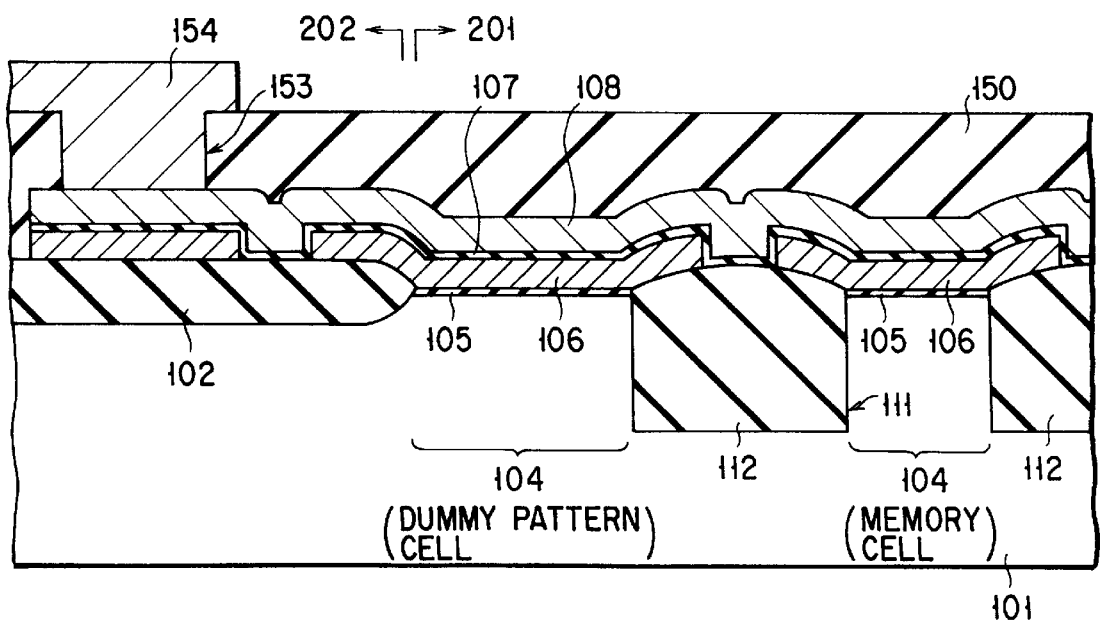
FIG. 9 is a cross sectional view of part of an EEPROM, for illustrating still another conventional nonvolatile semiconductor memory device.
Figure 10:
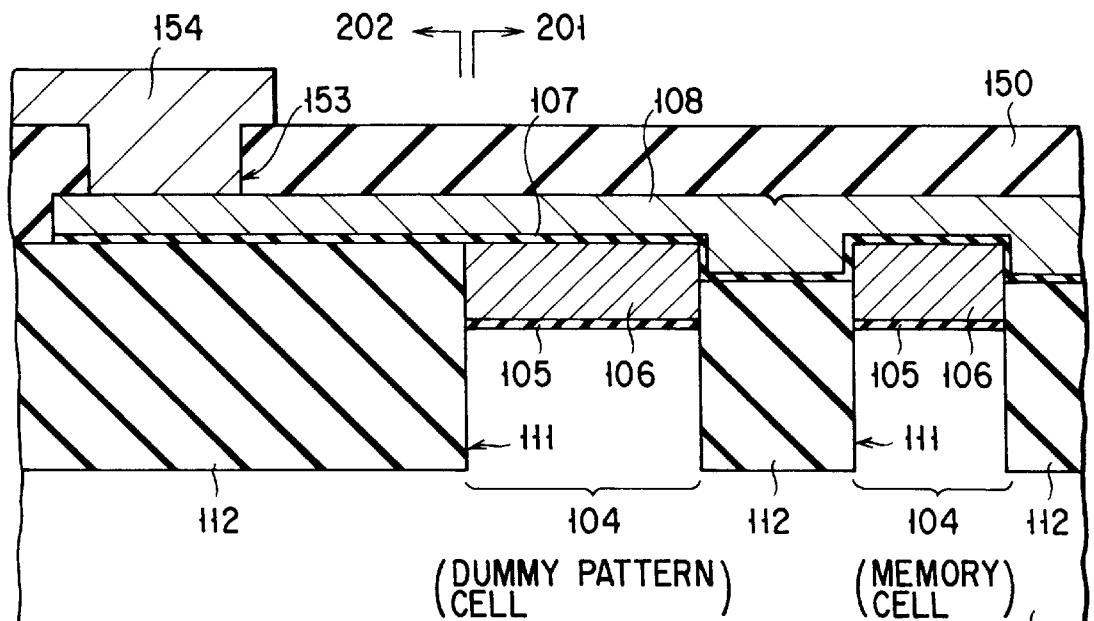
FIG. 10 is a cross sectional view of part of an EEPROM, for illustrating another conventional nonvolatile semiconductor memory device.
Figure 11:
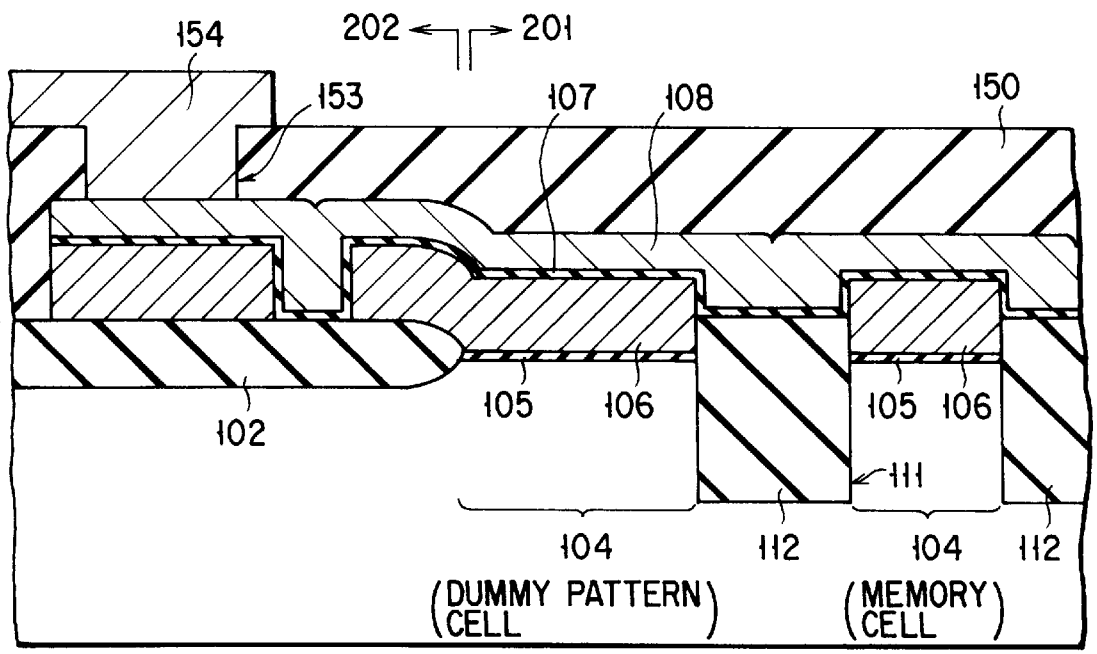
FIG. 11 is a cross sectional view of part of an EEPROM, for illustrating still another conventional nonvolatile semiconductor memory device.
Figure 12:
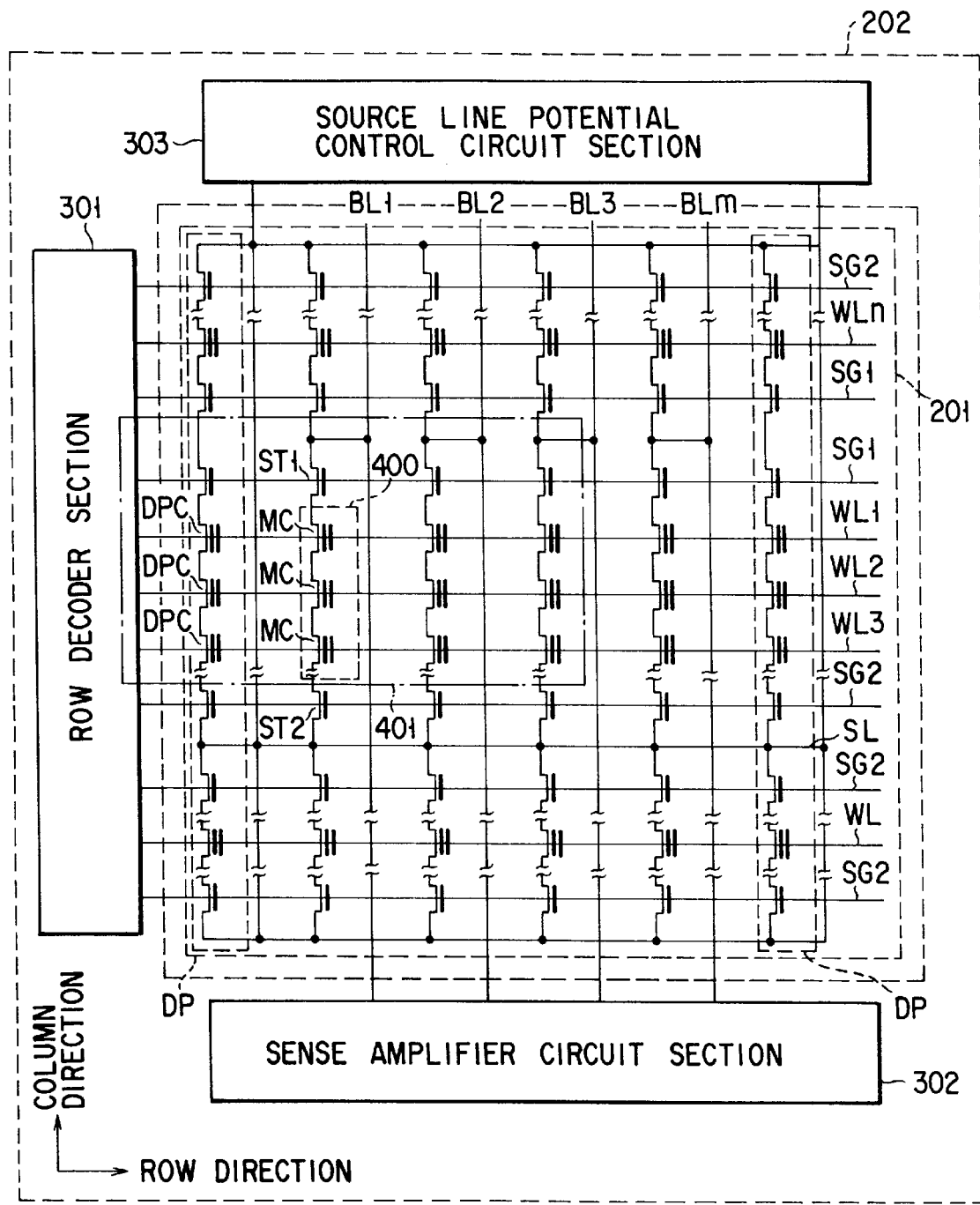
FIG. 12 is a circuit diagram showing an extracted main portion of a NAND type EEPROM, for illustrating a nonvolatile semiconductor memory device according to a first embodiment of this invention.

There will now be described a nonvolatile semiconductor memory device according to an embodiment of this invention by taking a NAND type EEPROM as an example. FIG. 12 is a circuit diagram showing an extracted main portion of a NAND type EEPROM according to a first embodiment of this invention. As shown in FIG. 12, a memory cell array section 201 having memory cells MC formed therein is provided in a memory chip and it is surrounded by a peripheral driving circuit section 202. In the peripheral driving circuit section 202, peripheral driving circuits for activating the storage function of the array section 201 are formed. In FIG. 12, those of the peripheral driving circuits which are directly connected to the array section 201, particularly, a row decoder section 301, sense amplifier circuit section 302 and source line potential control circuit section 303 are shown.

The NAND type EEPROM includes NAND type cells 400 each having a plurality of serially connected memory cells MC in the array section 201. One end of the current path of the NAND type cell 400 is connected to a corresponding one of bit lines BL (BL1 to BLm) via a selection transistor ST1 and the other end thereof is connected to a source line SL via a selection transistor ST2. The control gate of each memory cell MC is connected to a corresponding one of word lines WL (WL1 to WLn) and the gates of the selection transistors ST1, ST2 are respectively connected to selection gate lines SG1, SG2. The word lines WL1 to WLn and the selection gates SG1, SG2 are connected to the row decoder section 301. The bit lines BL1 to BLm are connected to the sense amplifier circuit section 302. The source line SL is connected to the source line potential control circuit section 303. In the outermost portion of the array section 201 along the column direction, a dummy pattern DP including dummy pattern cells DPC having no contact with the bit line BL is arranged and the memory cells MC are arranged on the inner side with respect to the dummy pattern DP.

Figure 13A:
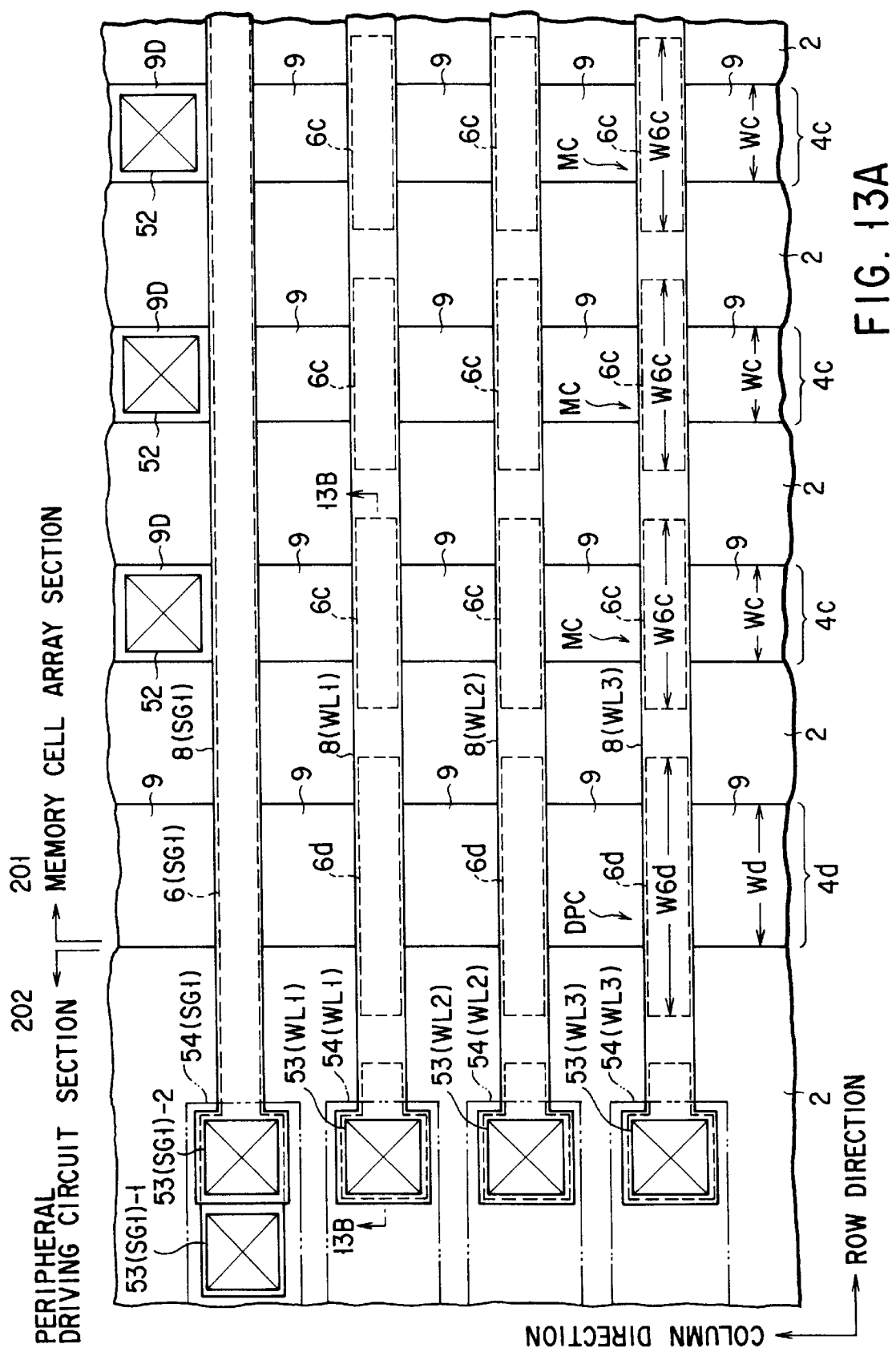
FIG. 13A is a pattern plan view showing part of a memory cell array section and a peripheral driving circuit section in a NAND type EEPROM.
Figure 13B:
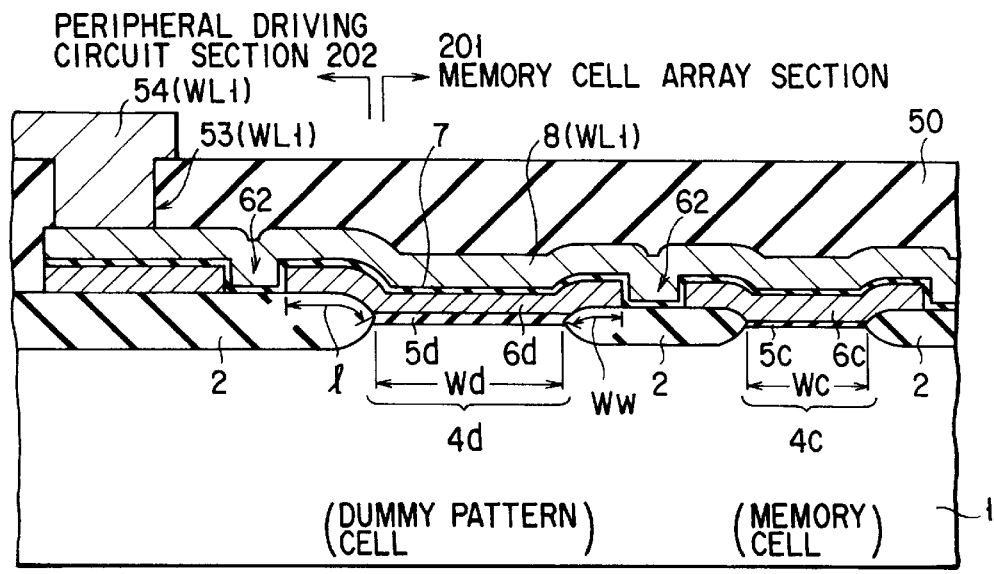
FIG. 13B is a cross sectional view taken along the line 13B—13B of the pattern shown in FIG. 13A.

FIG. 13A is a pattern plan view showing a portion of the circuit shown in FIG. 12 and surrounded by one-dot-dash lines 401 and FIG. 13B is a cross sectional view taken along the line 13B—13B of the pattern shown in FIG. 13A. As shown in FIGS. 13A and 13B, a LOCOS element isolation region 2 is formed on the main surface of a p-type silicon substrate (or p-type well) 1 to isolate active regions 4 (4d, 4c) of the array section 201. The active region 4d lying in the outermost portion along the column direction of the array section 201 is a portion in which the dummy pattern cells DPC which are not used as the memory cells are formed and the active region 4c is a portion in which the memory cells MC are formed. In this embodiment, the width Wd of the active region 4d is made larger than the width Wc of the active region 4c.

A thin gate insulating film ($SiO_2$: which is hereinafter referred to as a tunnel insulating film) 5c in which a tunnel current can flow is formed on the active region 4c. Further, a gate insulating film ($SiO_2$) 5d thicker than the tunnel insulating film 5c is formed on the active region 4d. A floating gate 6c is formed on the tunnel insulating film 5c and a floating gate 6d is formed on the gate insulating film 5d. One end portion of the floating gate 6d extending in the column direction is disposed on the isolation region 2 of the array section 201 and the other end portion thereof is disposed on the isolation region 2 of the circuit section 202.

A second gate insulating film 7 is formed on the floating gates 6d, 6c, and control gates 8(WL1) to 8(WL3) acting as the word lines WL (WL1 to WL3) are formed on the second gate insulating film. With this structure, each of the memory cells MC is formed with a stacked gate structure having the floating gate 6c and the control gate 8(WL). The dummy pattern cell DPC also has the same stacked gate structure. The control gates 8(WL1) to 8(WL3) are respectively connected to metal wirings 54(WL1) to 54(WL3) on the isolation region 2 of the circuit section 202 via contact holes 53(WL1) to 53(WL3) formed in an inter-level insulating film 50. The metal wirings 54(WL1) to 54(WL3) are connected to transistors in the row decoder 301 shown in FIG. 12.

Further, the selection gate line SG(SG1) is formed with a stacked gate structure having a first-layered selection gate line 6(SG1) which is formed of the same film as a conductive film used for forming the floating gates 6c, 6d and which is not divided in the row direction and a second-layered selection gate line 8(SG1) which is formed of the same film as a conductive film for forming the control gates 8(WL1) to 8(WL3). The first-layered selection gate line 6(SG1) is connected to a metal wiring 54(SG1) on the isolation region 2 of the circuit section 202 via a contact hole 53(SG1)-1 formed in the inter-level insulating film 50. Likewise, the second-layered selection gate line 8(SG1) is connected to the metal wiring 54(SG1) on the isolation region 2 of the circuit section 202 via a contact hole 53(SG1)-2 formed in the inter-level insulating film 50. Like the metal wirings 54(WL1) to 54(WL3), the metal wiring 54(SG1) is connected to the transistors of the row decoder section 301 shown in FIG. 12.

Further, N-type diffused layers 9 function as source/drain regions of the memory cells MC. In this case, an N-type diffused layer 9D is a diffused layer connected to a bit line (not shown) via a contact hole 52 formed in the inter-level insulating film 50 and functions as a drain of the NAND type cell 400. In the pattern plan view of FIG. 13A, an N-type diffused layer acting as a source is not shown.

In FIGS. 13A and 13B, the width W6d of the floating gate 6d in the row direction is larger than the width W6c of the floating gate 6c in the row direction. This structure is provided because there occurs a case wherein the dimension of the floating gate is not the same in the outer portion of the array section 201 in which the periodicity of the pattern is not provided and in the inner portion thereof. Further, the height of the isolation region 2 from the main surface of the substrate 1 may be larger in the circuit section 202 in which a large active region pattern is repeated than in the array section 201 in which a fine active region pattern is repeated in some cases. In such a case, it is difficult to set the widths of slits 62 to the same value in the array section 201 and the circuit section 202. Further, the width l of that portion of the circuit section 202 which extends on the isolation region 2 becomes longer than the width Ww of the wings that are those portions of the floating gates 6c and 6d which are provided on the isolation region 2 of the array section 201. Therefore, as is explained in the "BACKGROUND OF THE INVENTION", the capacitance C2 between the control gate 8(WL) and the floating gate 6d in the dummy pattern cell DPC becomes larger than the capacitance C2 in the memory cell MC.

In the first embodiment described above, the gate insulating film 5d is made thicker than the tunnel insulating film 5c. According to the equation (8) described in the "BACKGROUND OF THE INVENTION", if the film thickness (Td) of the gate insulating film 5d is increased, the potential (VFG) of the floating gate 6d is raised and a voltage applied to the gate insulating film 5d increases. However, according to the equation (10), the electric field Ed applied to the gate insulating film 5d is lowered by increasing the film thickness (Td). In addition, if the potential (VFG) of the floating gate 6d is raised, the potential difference between the control gate 8(WL) and the floating gate 6d becomes smaller. That is, a voltage applied to the second gate insulating film 7 can be lowered.

Based on the above conditions, according to the NAND type EEPROM with the construction shown in FIGS. 12, 13A and 13B, the electric field Ed applied to the gate insulating film 5d and the voltage applied to the second gate insulating film 7 can be lowered by making the film thickness of the gate insulating film 5d of the dummy pattern cell DPC larger than the film thickness of the tunnel insulating film 5c of the memory cell MC. As a result, even if the pattern of the cells lying in the outermost portion of the array section 201 and the pattern of the cells lying on the inner side thereof are different from each other, a lowering in the insulating characteristic between the substrate 1 and the control gates 8(WL1) to 8(WL3) can be suppressed and the characteristic of the memory cell MC can be made difficult to be deteriorated. The film thickness of the gate insulating film 5d of the dummy pattern cell DPC and the film thickness of the tunnel insulating film 5c of the memory cell MC can be set to optimum values by setting the parameters in the equation (11) to set the ratio of the electric field Ed to the electric field Ec in a range of $0.5 \leq Ed/Ec \leq 1$, more preferably, to set the ratio Ed/Ec closer to 1.

Further, the width l of a portion of the floating gate 6d extending on the isolation region 2 increases the opposing area between the floating gate 6d and the control gate 8(WL). Therefore, the capacitance C2 in the dummy pattern cell DPC increases and a voltage applied to the gate insulating film 5d is raised. For this reason, it is preferable to set the width l as small as possible. However, it is extremely difficult to set the width l of the floating gate 6d extending on the isolation region 2 equal to the width Ww of the wing because of the condition of lithography and a difference in the height of the isolation region 2 as described before. Therefore, in the first embodiment, the width Wd of the active region 4d of the dummy pattern cell DPC is made larger than the width Wc of the active region 4c of the memory cell MC.

According to the above structure, since the capacitance C1 between the floating gate 6d and the substrate 1 can be increased with an increase in the capacitance C2, an increase in the coupling ratio C2/(C1+C2) indicated by the equation (1) can be suppressed. Thus, the potential (VFG) of the floating gate 6d can be prevented from being unnecessarily raised and a lowering in the insulating characteristic of the gate insulating film 5d can be suppressed.

Further, the structure is equivalently attained by making the area (Wd×L: L is the channel length) of the channel region of the dummy pattern cell DPC larger than the area (Wc×L: L is the channel length) of the channel region of the memory cell MC. Therefore, the following modification can be made and may be formalized by the following expression (12).

$$1 \geq Ed/Ec = \frac{Tc + \frac{\varepsilon 1 \cdot Wc}{\varepsilon 2(Wc + 2Ww)} \cdot T2}{Td + \frac{\varepsilon 1 \cdot Wd}{\varepsilon 2(Wd + Ww + l)} \cdot T2} \quad (12)$$

In the expression (12), Ed indicates an electric field applied to the gate insulating film 5d, Ec indicates an electric field applied to the tunnel insulating film 5c, and T2 indicates the film thickness of the second gate insulating film 7.

Based on the expression (12), the dimensions of various portions of the dummy pattern cell DPC, that is, the width Wd of the active region 4d, the width l of a portion of the circuit section 202 extending on the isolation region 2 and the film thickness Td of the gate insulating film 5d are set such that the relation of $(Ed/Ec) \leq 1$ can be attained. By appropriately setting the dimensions, an increase in the potential (VFG) of the floating gate 6d by an increase in the capacitance C2 in the dummy pattern cell DPC of the outermost portion can be suppressed.

Figure 14:
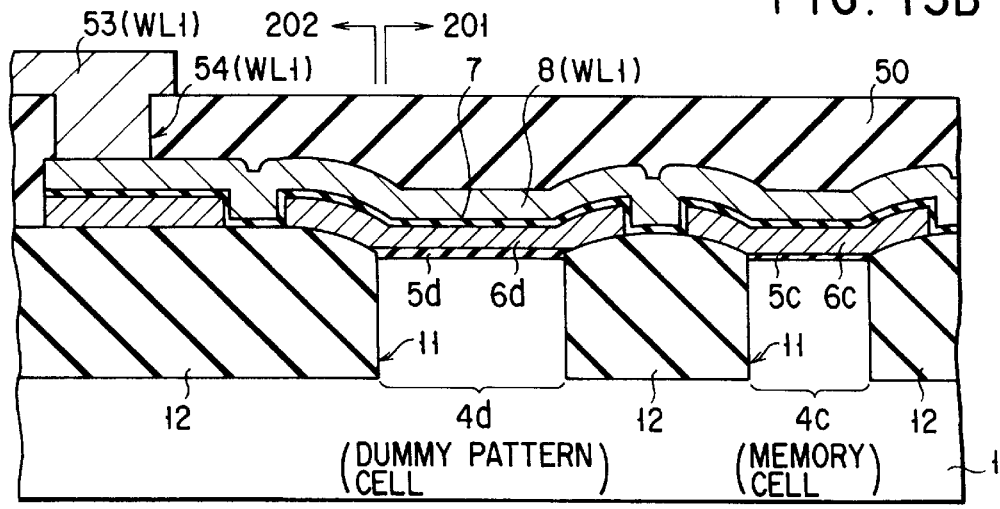
FIG. 14 is a cross sectional view showing part of a NAND type EEPROM, for illustrating a nonvolatile semiconductor memory device according to a second embodiment of this invention.
Figure 15:
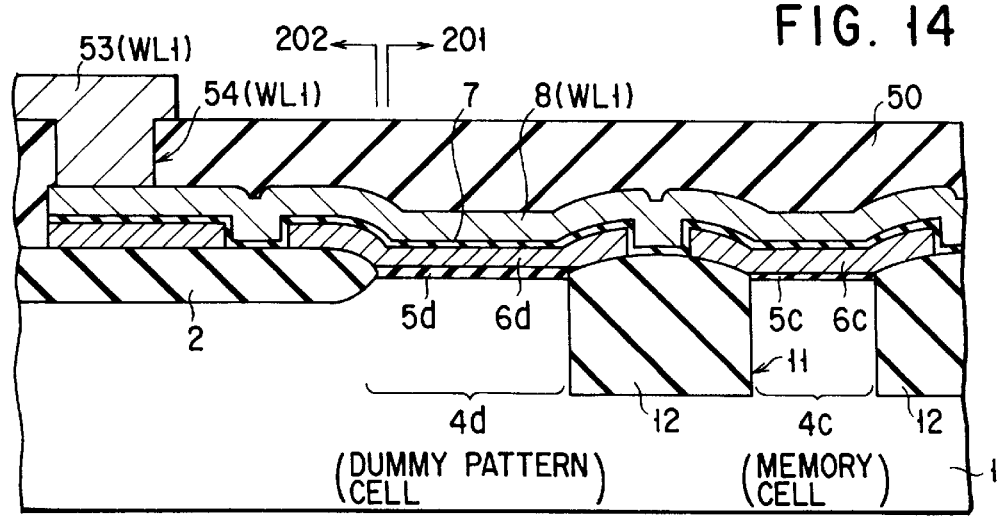
FIG. 15 is a cross sectional view showing part of a NAND type EEPROM, for illustrating a nonvolatile semiconductor memory device according to a third embodiment of this invention.

Next, nonvolatile semiconductor memory devices according to the second and third embodiments of this invention are explained with reference to FIGS. 14 and 15. FIG. 14 is a cross sectional view showing another example of the construction of the NAND type EEPROM, and FIG. 15 is a cross sectional view showing still another example of the construction of the NAND type EEPROM. The cross sectional views shown in FIGS. 14 and 15 correspond to the cross sectional view taken along the line 13B—13B of the pattern shown in FIG. 13A. In FIGS. 14 and 15, portions which are the same as those of FIG. 13B are denoted by the same reference numerals.

In the second embodiment shown in FIG. 14, a trench element isolation region 12 formed by forming trenches 11 in the main surface of the substrate I and filling an insulating material such as silicon dioxide into the trenches 11 is used for element isolation in both of an array section 201 and a circuit section 202.

In the third embodiment shown in FIG. 15, a trench element isolation region 12 is used for element isolation of an array section 201 and a LOCOS element isolation region 2 is used for element isolation of a circuit section 202.

Like the first embodiment, in the case of the second and third embodiments, the same effect as in the first embodiment can be attained by making the film thickness of the gate insulating film 5d of the dummy pattern cell DPC larger than the film thickness of the tunnel insulating film 5c of the memory cell MC or making the width Wd of the active region 4d of the dummy pattern cell DPC larger than the width Wc of the active region 4c of the memory cell MC, for example.

Next, a nonvolatile semiconductor memory device according to the fourth embodiment of this invention is explained by taking a NAND type EEPROM as an example together with the manufacturing method thereof. FIGS. 16A to 16F are pattern plan views showing the main manufacturing steps of the NAND type EEPROM in an order of the manufacturing steps.

Figure 16A:
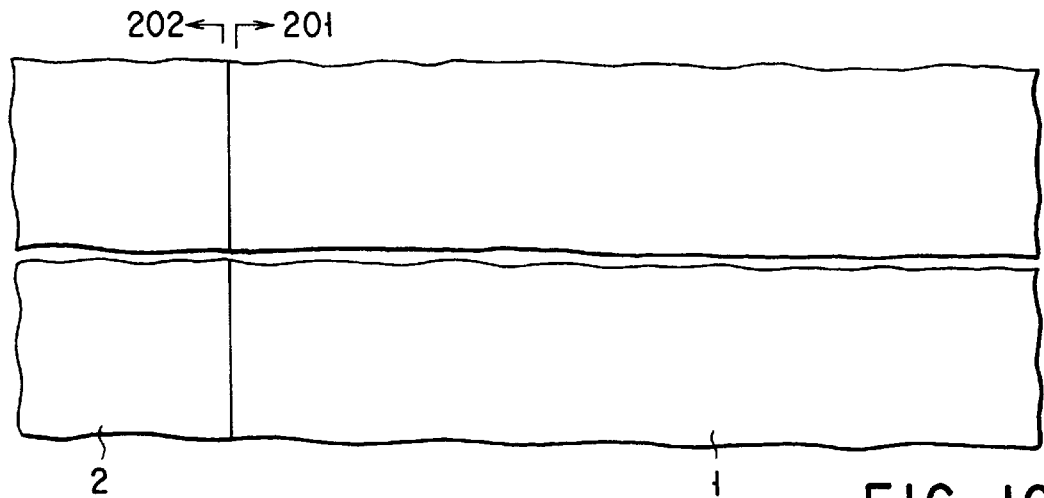
FIGS. 16A to 16F are pattern plan views showing part of a NAND type EEPROM in a manufacturing order, for illustrating a method for manufacturing a nonvolatile semiconductor memory device according to a fourth embodiment of this invention.

As shown in FIG. 16A, an element isolation region 2 with a thickness of approx. 0.3 to 0.8 μm is formed in a region of the main surface of a p-type silicon substrate (or p-type well) 1 which corresponds to a circuit section 202 by use of the LOCOS element isolation technique.

Figure 16B:
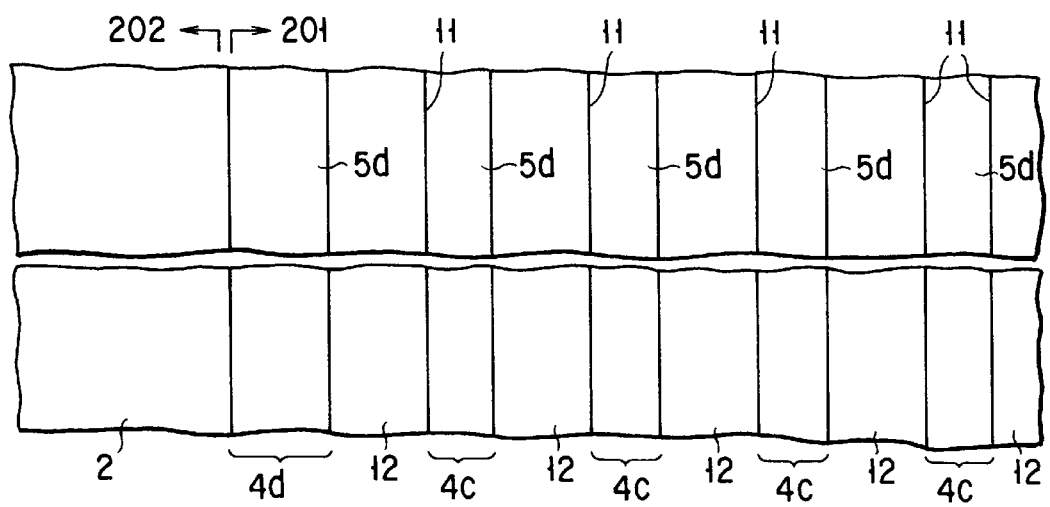

Next, as shown in FIG. 16B, trenches 11 with a depth of approx. 0.3 to 0.7 μm are formed according to the element isolation pattern in a region of the main surface of the substrate 1 which corresponds to an array section 201 and a filling insulating material 12 such as $SiO_2$, TEOS or BPSG is filled in the trenches 11, for example. Then, the surface of the insulating material 12 is made flat by use of the etch-back or CMP method and first gate insulating films 5d, for example, thermal oxidation films or oxide-nitride films are formed on the main surface portions of the substrate 1 which are exposed in correspondence to the active regions 4c, 4d.

Figure 16C:
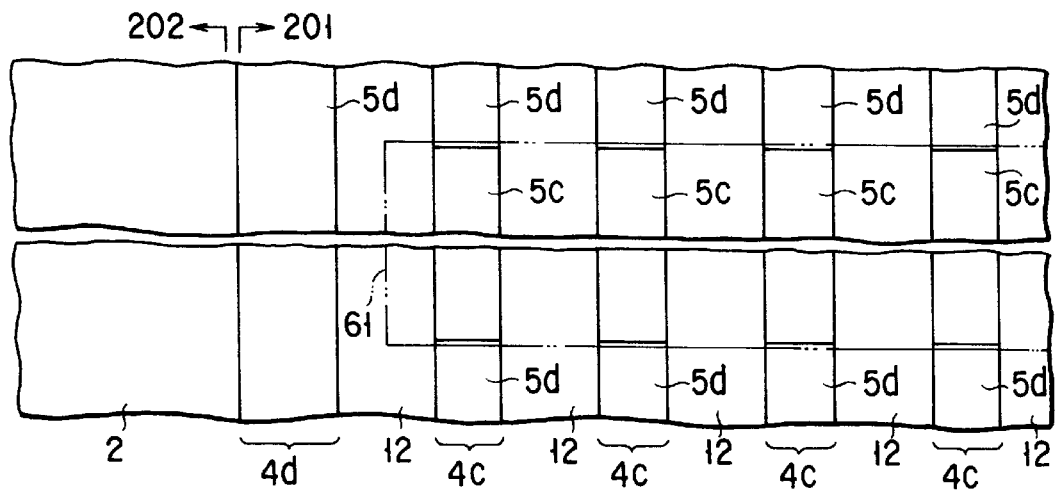

After this, as shown in FIG. 16C, a portion in which selection transistors ST are to be formed and a portion in which a dummy pattern DP is to be formed are covered in the array section 201, the first gate insulating films 5d are selectively removed by use of a mask 61 having windows in portions in which memory cells are to be formed so as to selectively expose the main surface of the substrate 1. Next, tunnel insulating films 5c for example, thermal oxidation films thinner than the first gate insulating films 5d are formed on the exposed main surface portions of the substrate 1.

Figure 16D:
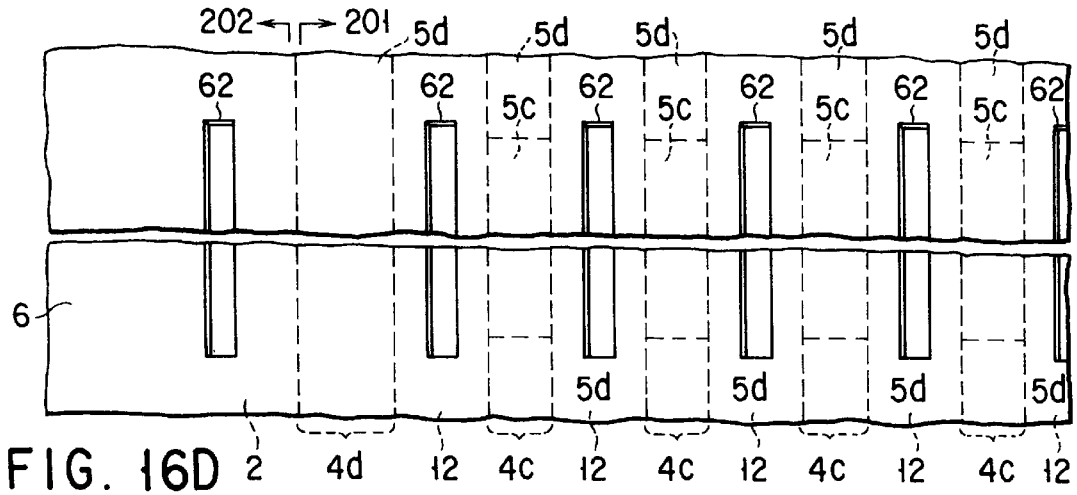

Next, as shown in FIG. 16D, a first gate 6 of, for example, N-type polysilicon or amorphous silicon is formed on the entire surface of the resultant semiconductor structure. Then, slits 62 for dividing the floating gates adjacent in the row direction are formed in the first gate 6 of the trench element isolation region 12 of the array section 201. At this time the same slit 62 for dividing the floating gates of the dummy pattern cells DPC is formed in the LOCOS element isolation region 2 in the circuit section 202.

Figure 16E:
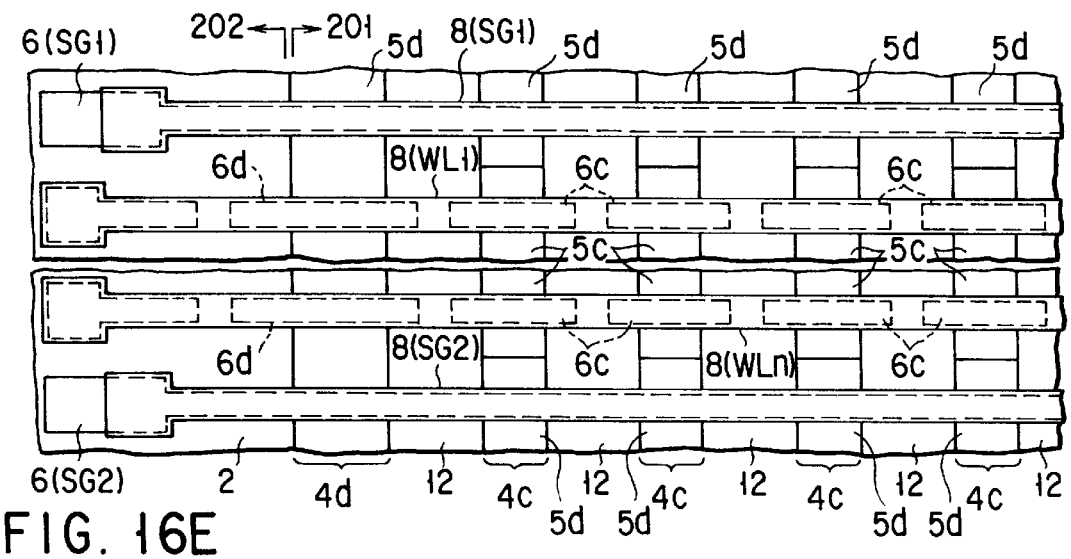

Next, as shown in FIG. 16E, after a second gate insulating film such as a laminated film (ONO film) of oxide film/nitride film/oxide film or an oxide-nitride film is formed, a second gate 8 of, for example, N-type polysilicon, amorphous silicon or silicide such as tungsten silicide, or a laminated body thereof is formed on the above film. Then, the second gate 8 is patterned into word line patterns. At this time, the second gate insulating film and the first gate 6 are sequentially etched by use of the same mask. As a result, the second gate 8 is processed into patterns of second-layered selection gate lines 8(SG1), 8(SG2), and word lines 8(WL1), 8(WLn). At the same time, the first gate 6 is processed into patterns of first-layered selection gate lines 6(SG1), 6(SG2), and floating gates 6d, 6c. After this, the end portions of the second-layered selection gate lines 8(SG1), 8(SG2) on the LOCOS element isolation region 2 are etched to expose the first-layered selection gate lines 6(SG1), 6(SG2).

Figure 16F:
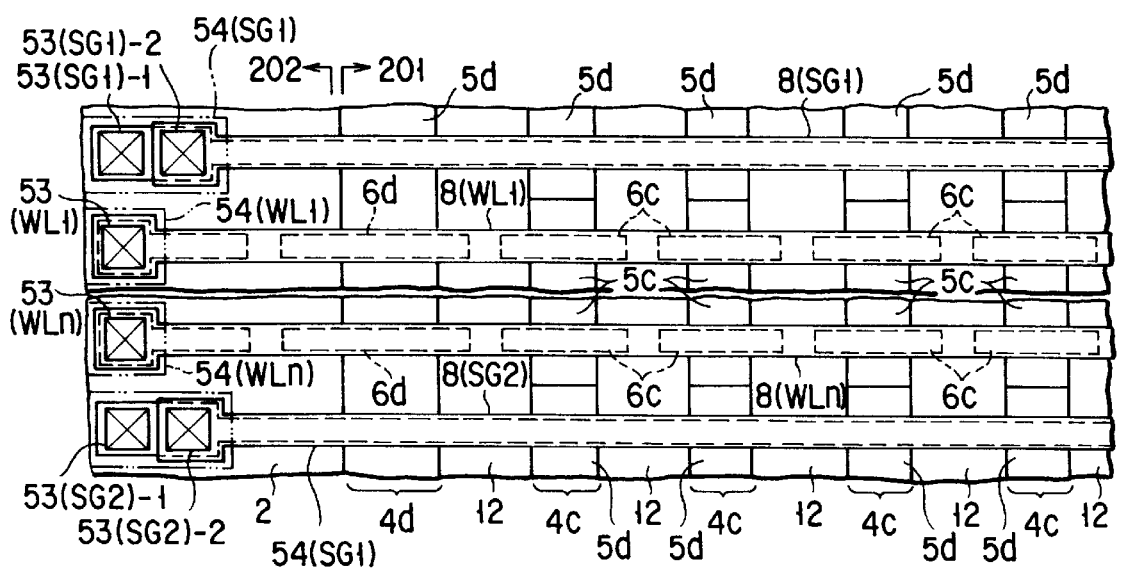

Next, as shown in FIG. 16F, after an inter-level insulating film 50 (which is not shown in FIG. 16F) of, for example, BPSG is formed, contact holes 53(SG1)-1, 53(SG2)-1 which communicate with the first-layered selection gate lines 6(SG1), 6(SG2) are formed in the inter-level insulating film 50 and contact holes 53(SG1)-2, 53(SG2)-2 which communicate with the second-layered selection gate lines 8(SG1), 8(SG2) and contact holes 53(WL1) to 53(WLn) which communicate with the word lines 8(WL1) to 8(WLn) are formed. Then, metal wirings 54(SG1), 54(WL1) to 54(WLn) and 54(SG2) are formed.

In the NAND type EEPROM formed by the above manufacturing method, since the gate insulating film 5d of the dummy pattern cell DPC is made thicker than the tunnel insulating film 5c of the memory cell MC, the same effect as in the EEPROM explained in the first to third embodiments can be attained.

Further, the gate insulating films of the selection transistors ST1, ST2 are normally made thicker than the tunnel insulating film 5c. Therefore, the thickness of the gate insulating film 5d is set equal to the thickness of the gate insulating films of the selection transistors ST1, ST2.

With this structure, the gate insulating film 5d of the dummy pattern cell DPC thicker than the tunnel insulating film 5c can be obtained by, for example, forming the gate insulating films (corresponding to the gate insulating film 5d in this embodiment) of the selection transistors ST1, ST2 and then simply changing the pattern of a mask for removing the gate insulating films from a portion in which the memory cells are to be formed. Therefore, the NAND type EEPROM can be formed without increasing the number of manufacturing steps.

Next, a nonvolatile semiconductor memory device according to a fifth embodiment of this invention is explained. The fifth embodiment is an example in which the self-aligned trench element isolation technique is used for the element isolation technique.

Figure 17:
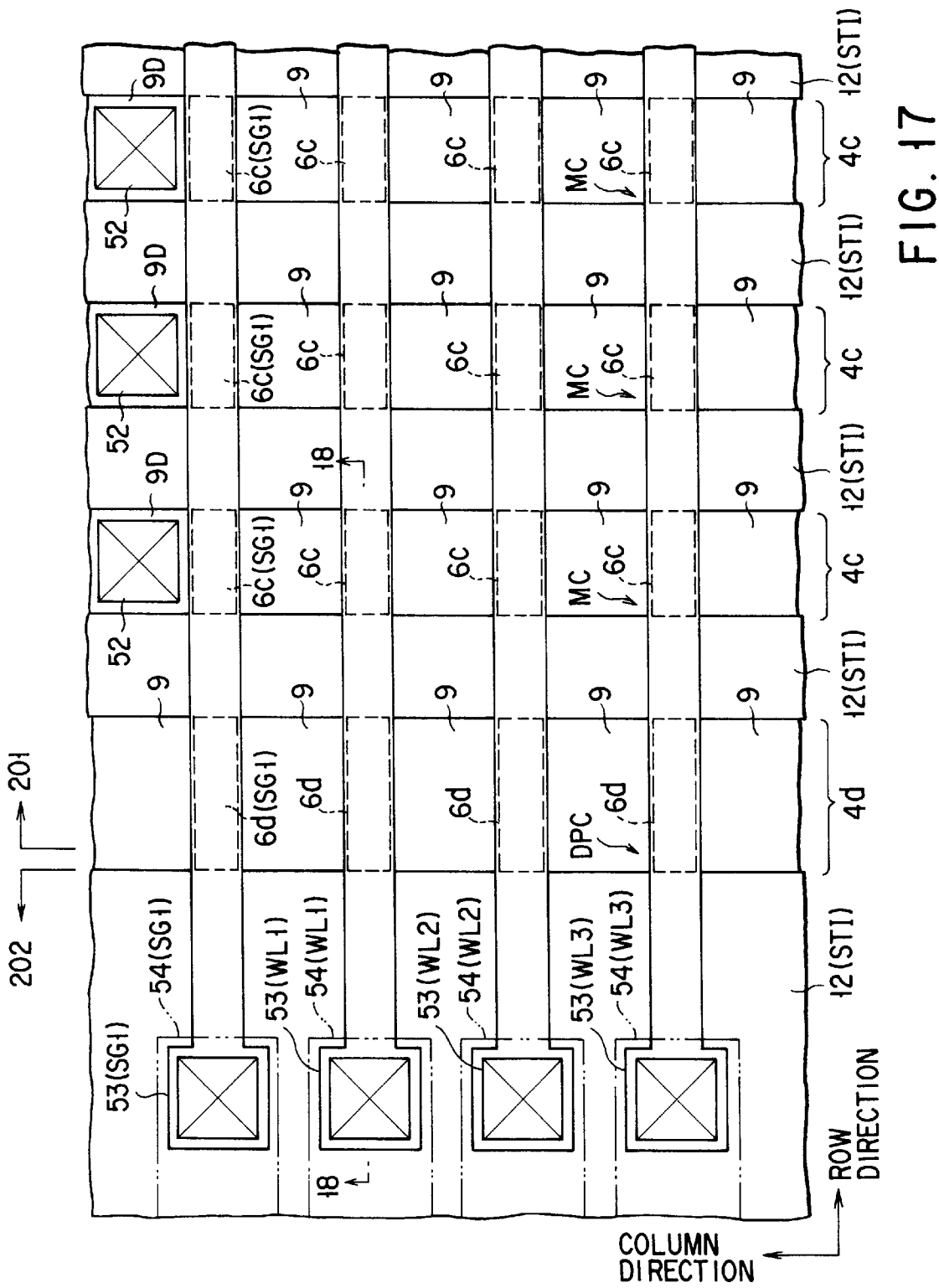
FIG. 17 is a pattern plan view showing part of a memory cell array section and part of a peripheral driving circuit section in a NAND type EEPROM, for illustrating a nonvolatile semiconductor memory device according to a fifth embodiment of this invention.
Figure 18:
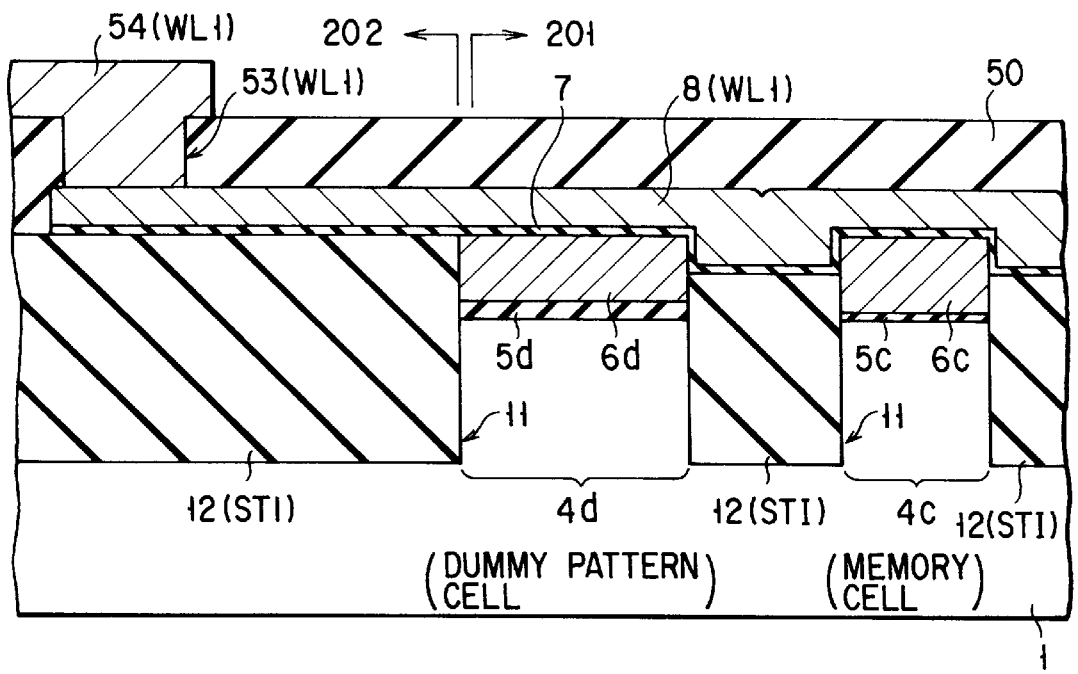
FIG. 18 is a cross sectional view taken along the line 18—18 of the pattern shown in FIG. 17.

FIG. 17 is a pattern plan view of a NAND type EEPROM, and FIG. 18 is a cross sectional view taken along the line 18—18 of FIG. 17. The pattern plan view shown in FIG. 17 corresponds to the circuit in the one-dot-dash lines 401 in the circuit of FIG. 12. In FIGS. 17 and 18, portions which are the same as those of FIGS. 13A and 13B are denoted by the same reference numerals.

As shown in FIGS. 17 and 18, a self-aligned trench element isolation region 12(ST1) is formed in a substrate 1 of an array section 201. The isolation region 12 is formed in a self-alignment manner with respect to the end portions of floating gates 6d, 6c in the column direction. The side wall of the floating gate 6c in the array section 201 is exposed from the isolation region 12. The reason is to make a capacitance C2 between the control gates 8(WL1) to 8(WL3) and the floating gate 6c larger than a capacitance C1 between the substrate 1 and the floating gate 6c. For this purpose, the side wall of the floating gate 6d lying in the outermost portion of the array section 201 is also exposed on the array section 201 side like the floating gate 6c. However, the side wall on the circuit section 202 side is not exposed from the isolation region 12(ST1).

Therefore, as is described in the "BACKGROUND OF THE INVENTION", in the dummy pattern cell DPC, the capacitance C2 between the control gate 8(WL) and the floating gate 6d is smaller than the capacitance C2 in the memory cell MC. For this reason, the potential (VFG) of the floating gate 6d becomes difficult to rise, and as a result, a high voltage will be applied to the second gate insulating film 7.

However, according to the fifth embodiment, since the film thickness of the gate insulating film 5d is made larger than the film thickness of the tunnel insulating film 5c, the capacitance C1 between the floating gate 6d and the substrate 1 becomes smaller. Therefore, the coupling ratio C2/(C1+C2) indicated by the equation (1) is increased so that the potential (VFG) of the floating gate 6d will tend to easily rise. As a result, a high voltage can be prevented from being applied to the second gate insulating film 7.

Thus, according to the NAND type EEPROM of the fifth embodiment, a lowering in the insulating characteristic between the control gate 8(WL1) and the substrate 1 can be suppressed and the characteristic of the memory cell MC can be made difficult to be lowered like the first to fourth embodiments even in a pattern in which the end portion of the floating gate 6d on the peripheral driving circuit section 202 side is not exposed by making the film thickness of the gate is insulating film 5d of the dummy pattern cell DPC larger than the film thickness of the tunnel insulating film 5c of the memory cell MC.

Figure 19:
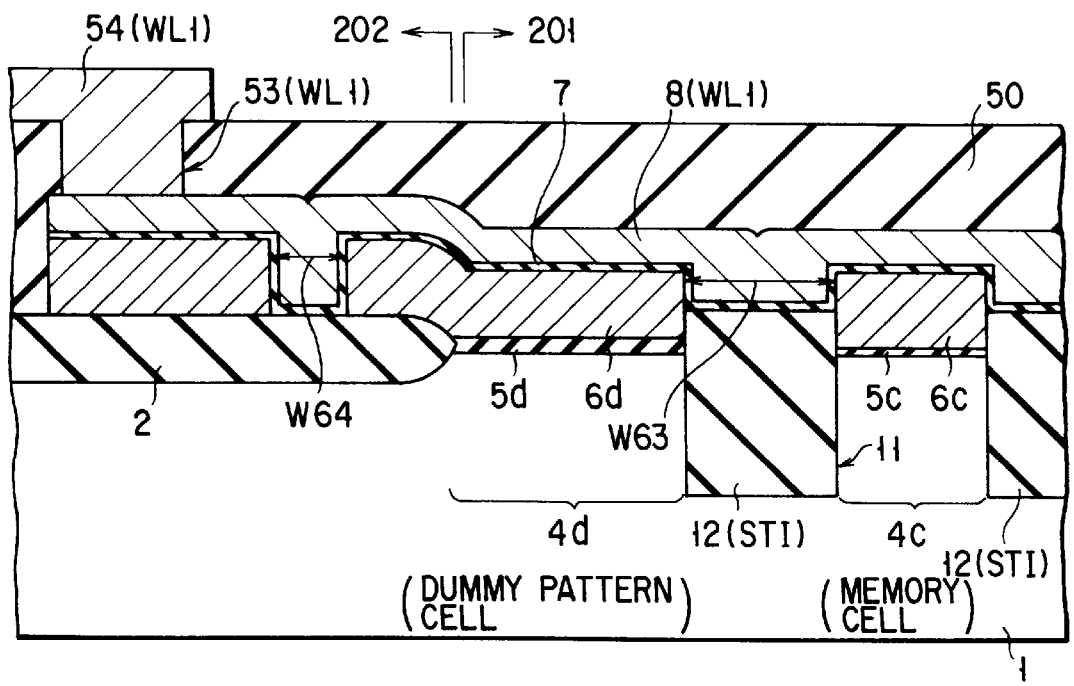
FIG. 19 is a cross sectional view showing part of a NAND type EEPROM, for illustrating a nonvolatile semiconductor memory device according to a sixth embodiment of this invention.

Next, a nonvolatile semiconductor memory device according to a sixth embodiment of this invention is explained. FIG. 19 is a cross sectional view of a NAND type EEPROM. The cross sectional view shown in FIG. 19 corresponds to the cross section taken along the line 18—18 of the pattern of FIG. 17. In FIG. 19, portions which are the same as those of FIG. 18 are denoted by the same reference numerals.

In the structure of FIG. 19, a self-aligned trench element isolation region 12(ST1) is used for element isolation in an array section 201 and a LOCOS element isolation region 2 is used for element isolation in a circuit section 202. In this case, the same effect as in the first embodiment can be attained by making the film thickness of the gate insulating film 5d of the dummy pattern cell DPC larger than the film thickness of the tunnel insulating film 5c of the memory cell MC or making the width Wd of the active region 4d of the dummy pattern cell DPC larger than the width Wc of the active region 4c of the memory cell MC.

Next, a nonvolatile semiconductor memory device and a method for manufacturing the same according to a seventh embodiment of this invention is explained by taking a NAND type EEPROM as an example. FIGS. 20A to 20F are pattern plan views showing the main manufacturing steps of the NAND type EEPROM in an order of the manufacturing steps.

Figure 20A:
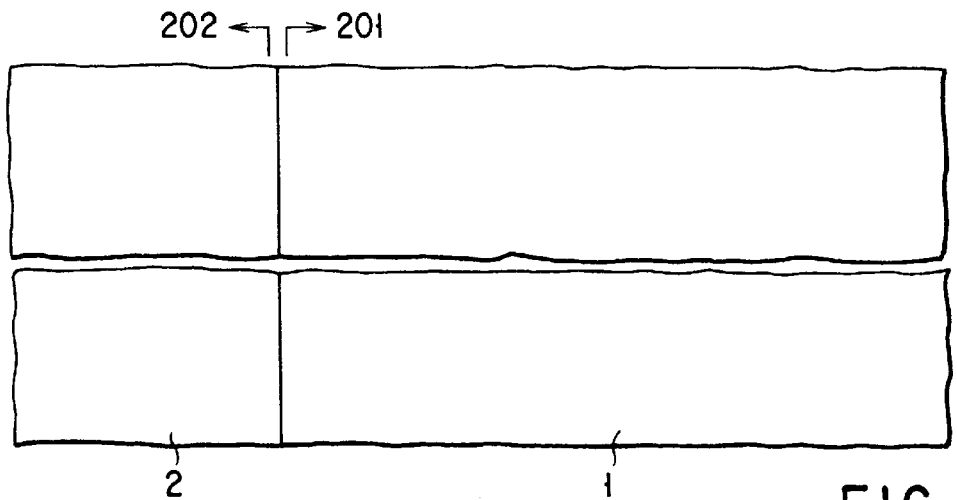
FIGS. 20A to 20F are pattern plan views showing part of a NAND type EEPROM in a manufacturing order, for illustrating a method for manufacturing a nonvolatile semiconductor memory device according to a seventh embodiment of this invention.

First, as shown in FIG. 20A, an element isolation region 2 with a thickness of approx. 0.3 to 0.8 μm is formed in a region of the main surface of a p-type silicon substrate (or p-type well) 1 which corresponds to a circuit section 202 by use of the LOCOS element isolation technique.

Figure 20B:
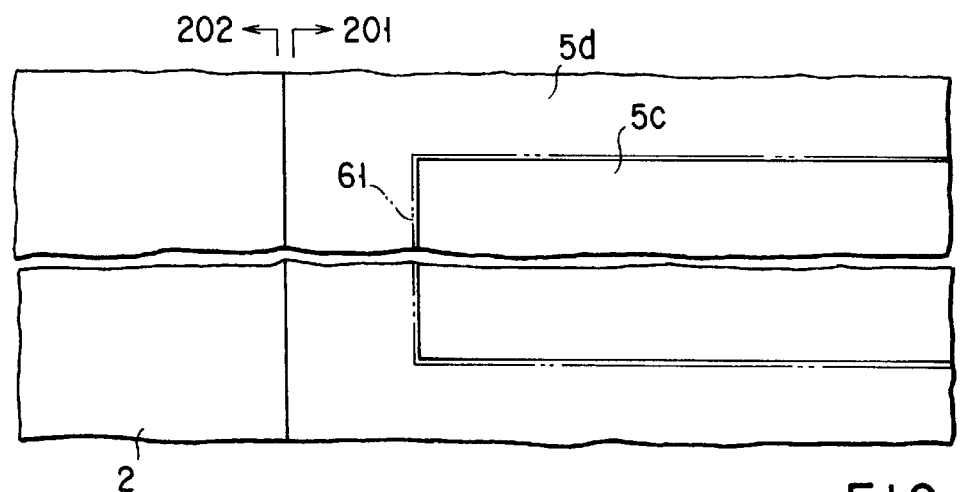

Next, as shown in FIG. 20B, a first gate insulating film 5d, for example, a thermal oxidation film or oxide-nitride film is formed on the main surface of the substrate which is exposed to the array section 201. Then, in the array section 201, a portion in which selection gate transistors ST are to be formed and a portion in which a dummy pattern DP is to be formed are covered, and the first gate insulating film 5d is selectively removed by use of a mask 61 having windows in portions in which memory cells are to be formed to expose the main surface of the substrate 1. Next, a tunnel insulating film 5c, for example, a thermal oxidation film thinner than the first gate insulating film 5d is formed on the exposed main surface of the substrate 1.

Figure 20C:
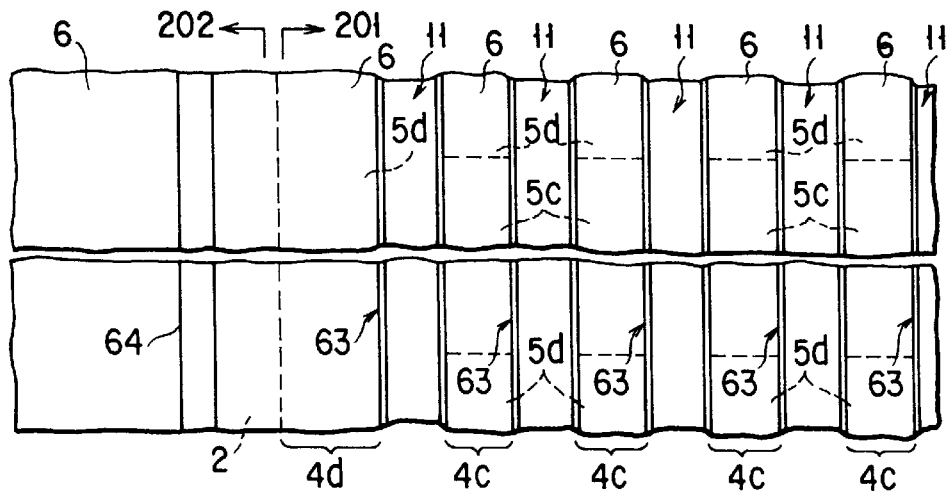

After this, as shown in FIG. 20C, a first gate 6 of, for example, N-type polysilicon or amorphous silicon is formed on the entire surface. Then, a film formed of a material which causes the etching rate different from that of the substrate 1, for example, a silicon dioxide film (not shown) is formed on the first gate 6. Next, slits 63 corresponding in position to the element isolation regions formed in the array section 201 are formed in the first gate 6. At this time, slits 64 for dividing the floating gates of the dummy pattern cells DPC are formed on the LOCOS element isolation region 2 in the circuit section 202. Then, the substrate 1 is etched to form trenches 11 by use of the first gate 6 on which the silicon dioxide film (not shown) is laminated as a mask.

Figure 20D:
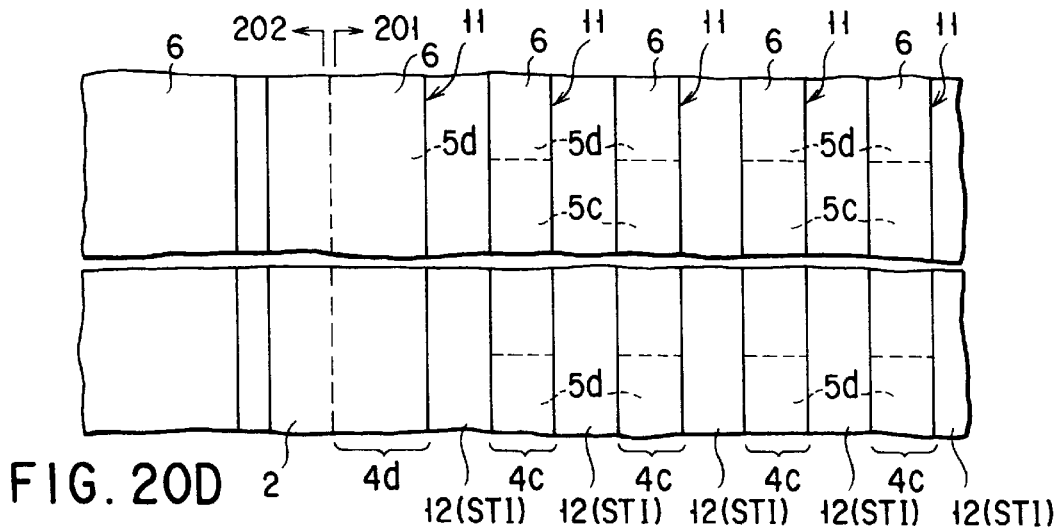

Next, as shown in FIG. 20D, the trenches 11 are filled with a filling insulating material of, for example, $SiO_2$, TEOS, BPSG. Then, the surface of the insulating material is made flat by use of the etch-back or CMP method. Next, the insulating film is etched back to expose the side wall of the first gate 6 by the RIE method or the like by use of a mask formed to cover the circuit section 202 and having a window on the array section 201.

Figure 20E:
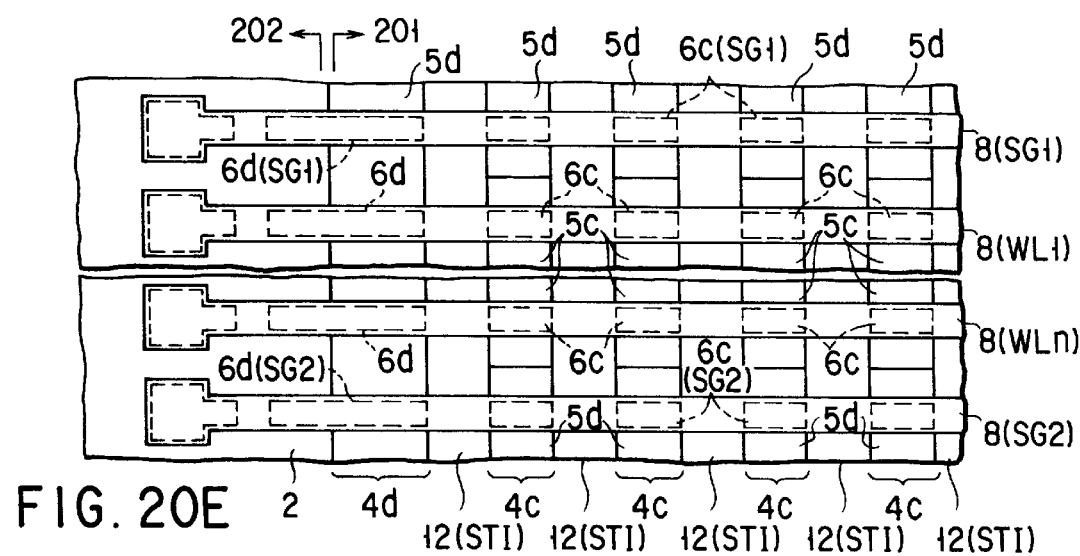

After this, as shown in FIG. 20E, after a second gate insulating film such as a laminated film (ONO film) of oxide film/nitride film/oxide film or an oxide/nitride film is formed, a second gate 8 of, for example, N-type polysilicon, amorphous silicon or silicide such as tungsten silicide, or a laminated body thereof is formed on the above film. Then, the second gate 8 is patterned into word line patterns. At this time, the second gate insulating film and the first gate 6 are sequentially etched by use of the same mask. As a result, the second gate 8 is processed into patterns of second-layered selection gate lines 8(SG1), 8(SG2) and word lines 8(WL1) to 8(WLn). At the same time, the first gate 6 is processed into patterns of floating gates 6d, 6c. Further, under the second-layered selection gate lines ((SG1), 8(SG2), patterns 6d(SG1), 6d(SG2), 6c(SG1) and 6c(SG2) of floating gate configuration are formed. It is preferable to remove the second gate insulating film (not shown) from the surface of the patterns of the floating gate configuration and directly connect the second-layered selection gate lines 8(SG1), 8(SG2) thereto.

Figure 20F:
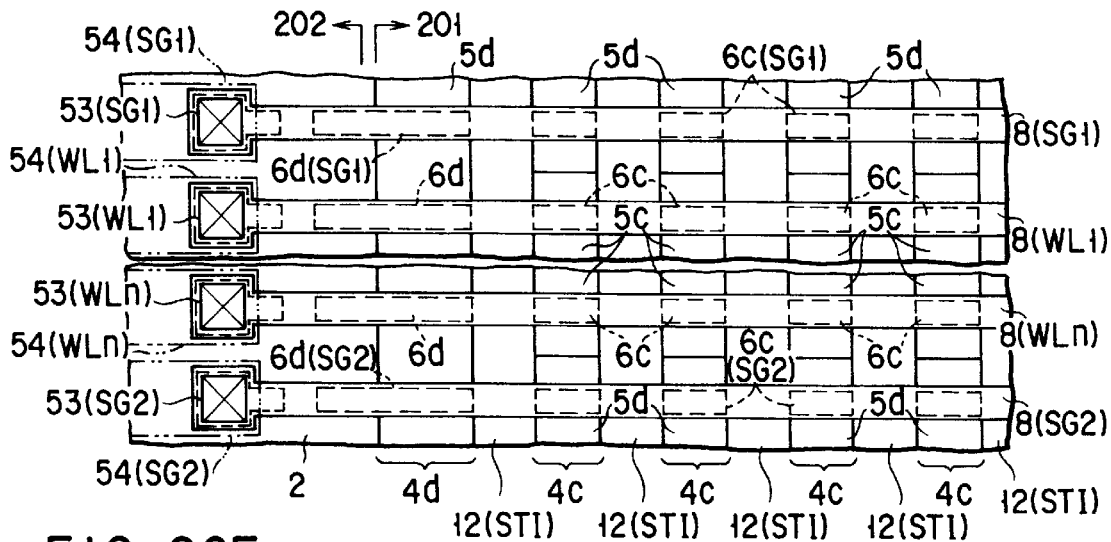

Next, as shown in FIG. 20F, after an inter-level insulating film 50 (which is not shown in FIG. 20F) of, for example, BPSG is formed, contact holes 53(SG1), 53(SG2) which communicate with the second-layered selection gate lines 8(SG1), 8(SG2) and contact holes 53(WL1) to 53(WLn) which communicate with the word lines 8(WL1) to 8(WLn) are formed in the inter-level insulating film 50. Then, metal wirings 54(SG1), 54(WL1) to 54(WLn) and 54(SG2) are formed.

In the NAND type EEPROM formed by the above manufacturing method, since the gate insulating film 5d of the dummy pattern cell DPC is made thicker than the tunnel insulating film 5c of the memory cell MC, the same effect as in the first to fourth embodiments can be attained.

Further, in the seventh embodiment, the gate insulating films of the selection transistors ST1, ST2 are made thicker than the tunnel insulating film 5c and the thickness of the gate insulating film 5d of the dummy pattern cell DPC is set equal to the thickness of the gate insulating films of the selection transistors ST1, ST2. Therefore, like the fourth embodiment, the gate insulating film 5d of the dummy pattern cell DPC thicker than the tunnel insulating film 5c can be obtained by, for example, forming the gate insulating films (corresponding to the gate insulating film 5d in this embodiment) of the selection transistors ST1, ST2 and then simply changing the pattern of a mask for removing the gate insulating films from a portion in which the memory cells are to be formed. Therefore, the NAND type EEPROM can be formed without increasing the number of manufacturing steps.

In a case wherein the self-aligned trench element isolation technique is used for element isolation in the array section 201 as in the fifth, sixth and seventh embodiments, there occurs a possibility that plasma damage will be applied to the first gate insulating film, that is, gate insulating film 5d and tunnel insulating film 5c in the etch-back process for exposing the side wall of the first gate 6. This is because the surface of the first gate 6 which is conductive is exposed during the etch-back process and charged particles collide with the exposed surface. The charged particles colliding with the first gate 6 apply the plasma damage to the gate insulating film 5d and tunnel insulating film 5c formed on the active regions 4d, 4c. The plasma damage becomes larger as the antenna ratio, that is, the ratio Sb/Sa of the exposed area Sb of the first gate 6 to the area Sa of the opposed surface of the first gate 6 to the active regions 4d, 4c becomes larger. Therefore, in order to reduce the plasma damage, it is important to set the antenna ratio as close to "1" as possible.

For this purpose, in the eighth embodiment, the plasma damage applied to the gate insulating film 5d and tunnel insulating film 5c is reduced in the EEPROM formed by using the self-aligned trench element isolation technique as in the fifth to seventh embodiments and the deterioration proceeding in the step of forming the above films can be further suppressed.

Figure 21A:
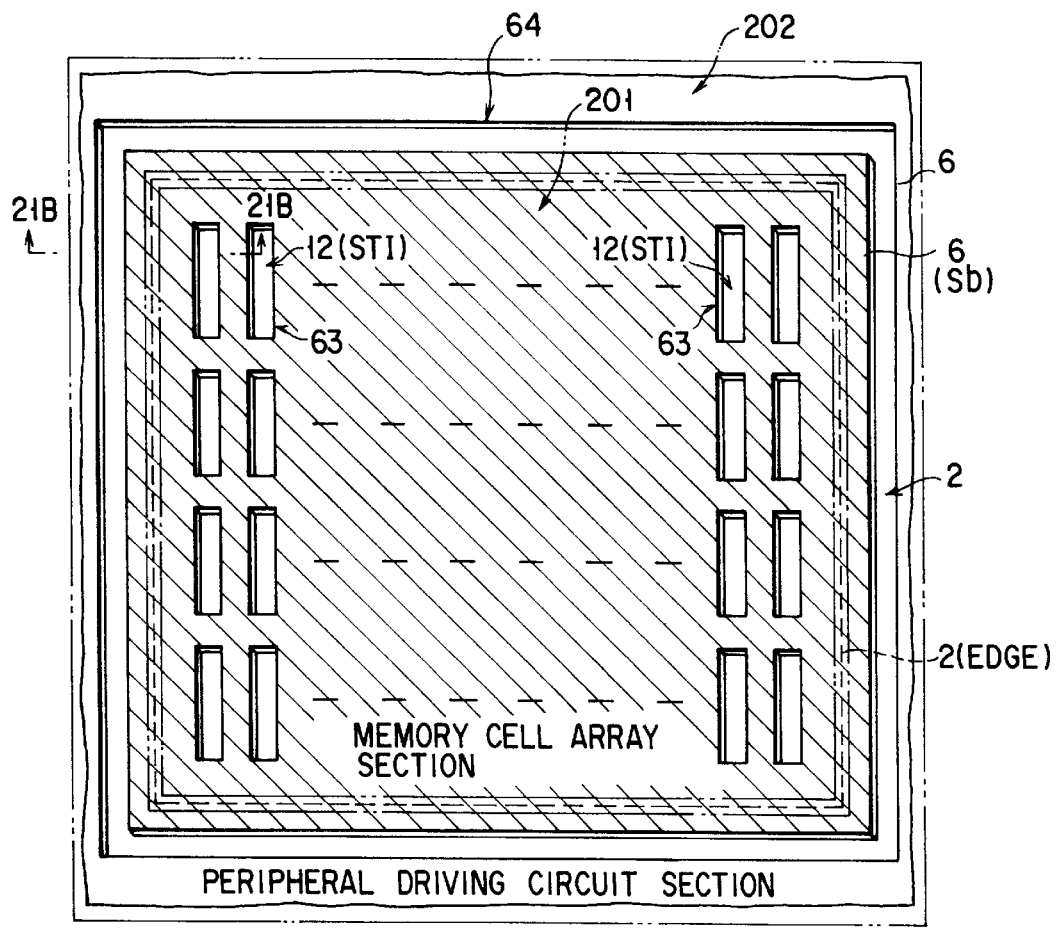
FIG. 21A is a pattern plan view schematically showing a semiconductor structure obtained when a slit forming process is effected for a first gate of an EEPROM, for illustrating a nonvolatile semiconductor memory device according to an eighth embodiment of this invention.
Figure 21B:
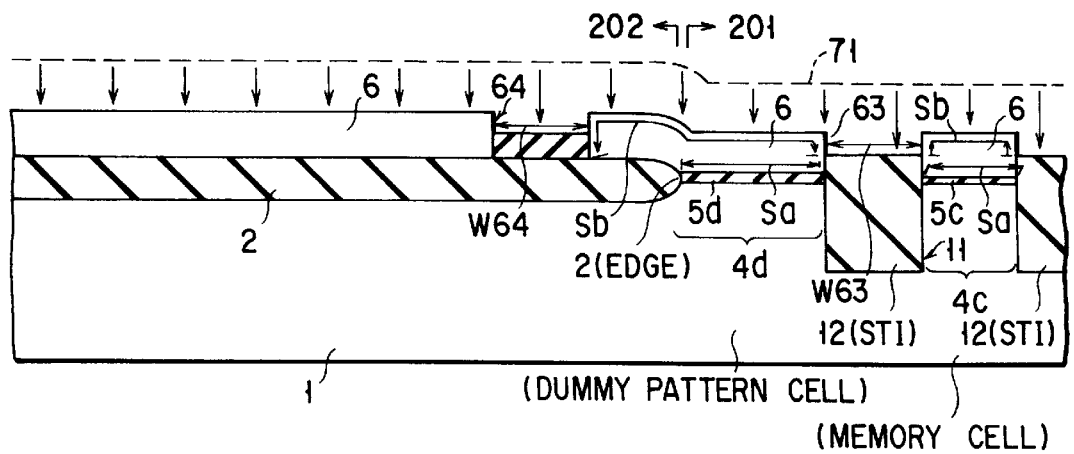
FIG. 21B is a cross sectional view taken along the line 21B—21B of the pattern shown in FIG. 21A.
Figure 22:
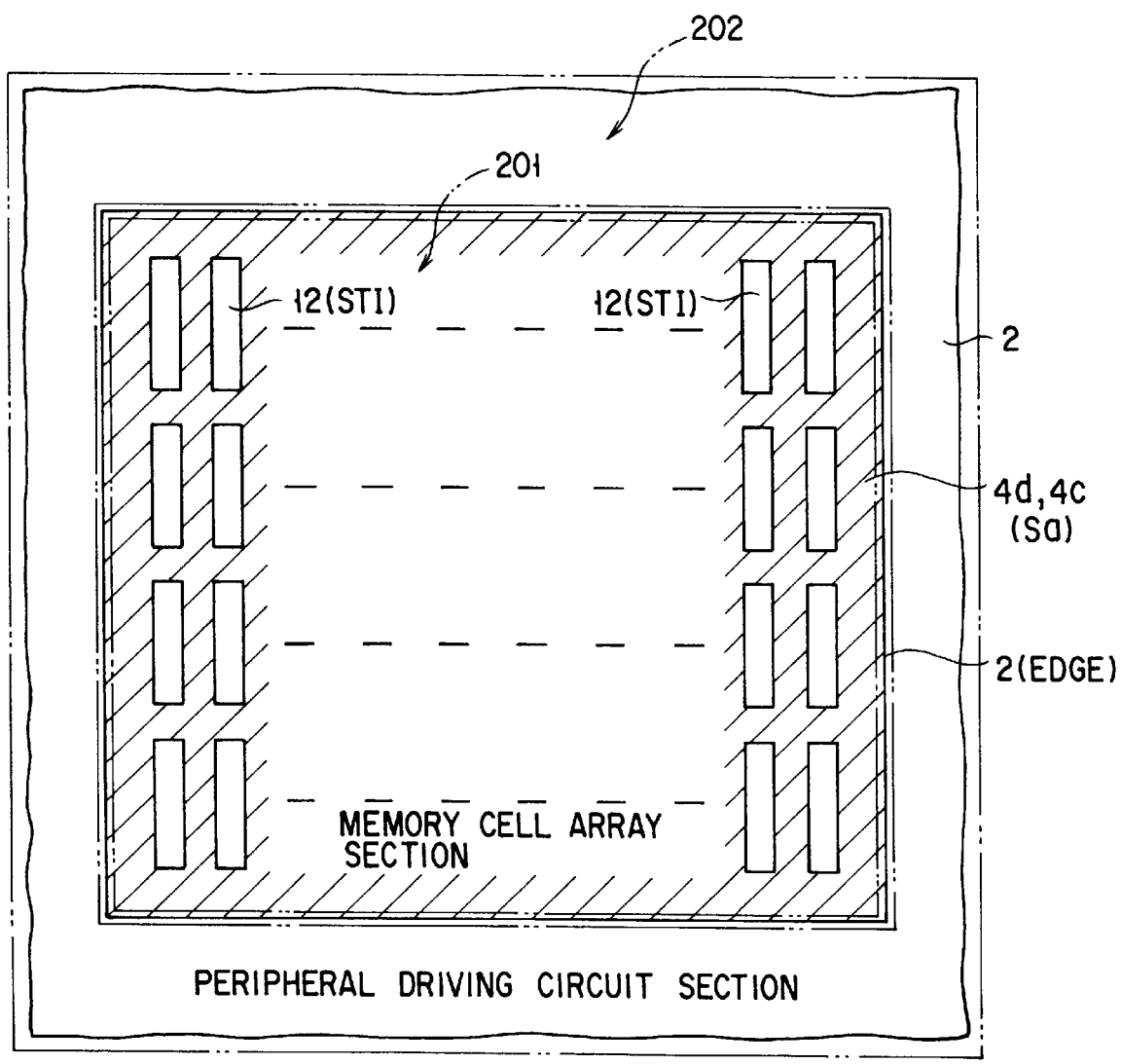
FIG. 22 is a pattern plan view showing the state in which the first gate shown in FIG. 21A is removed.

FIG. 21A is a pattern plan view schematically showing a semiconductor structure obtained when a slit forming process is effected for a first gate of an EEPROM, for illustrating a nonvolatile semiconductor memory device according to the eighth embodiment of this invention. FIG. 21B is a cross sectional view taken along the line 21B—21B of the pattern shown in FIG. 21A, and FIG. 22 is a pattern plan view showing the state in which the first gate 6 shown in FIG. 21A is removed.

As shown in FIG. 21A, in the eighth embodiment, a slit 64 formed on the LOCOS element isolation region 2 in the circuit section 202, for dividing the floating gates of the dummy pattern cells DPC is disposed along the edge of the array section 201 in a loop-like form.

Figure 23A:
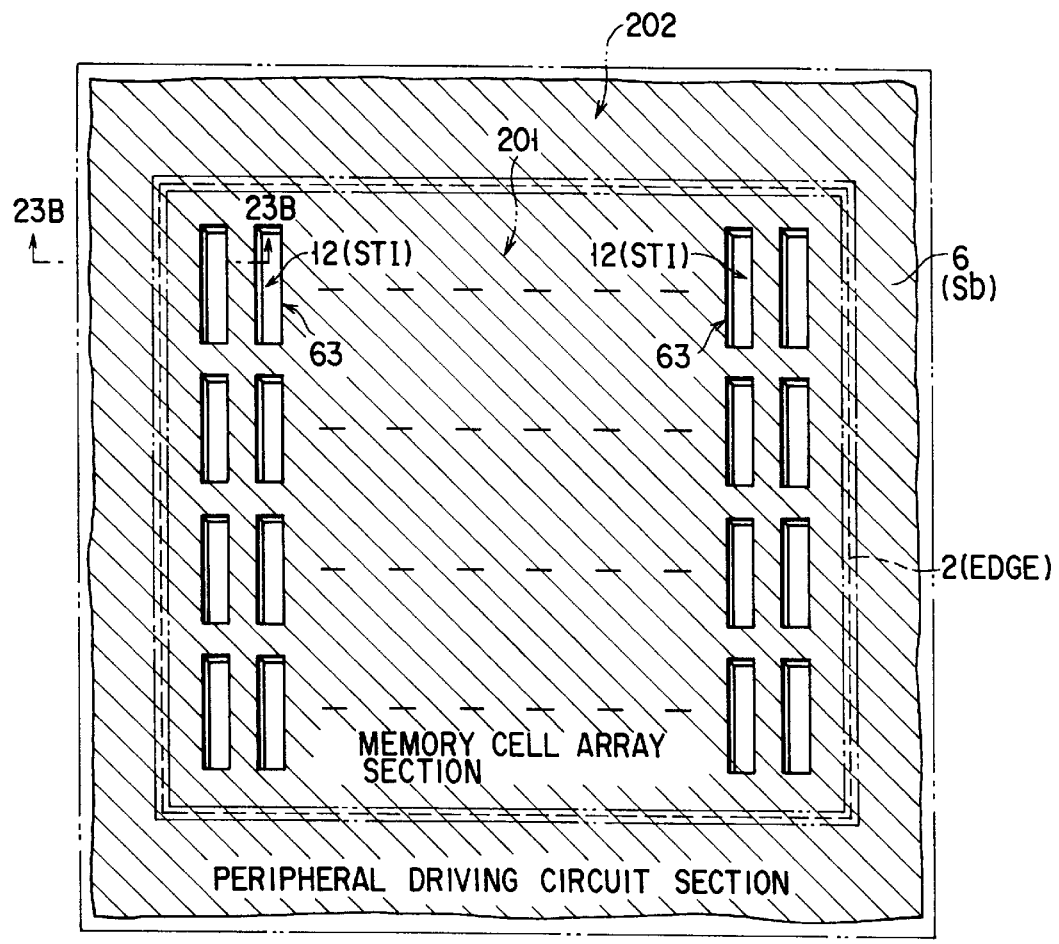
FIG. 23A is a pattern plan view showing a memory cell array section and a peripheral driving circuit section of an EEPROM for comparison with the eighth embodiment of this invention shown in FIGS. 21A and 21B.
Figure 23B:
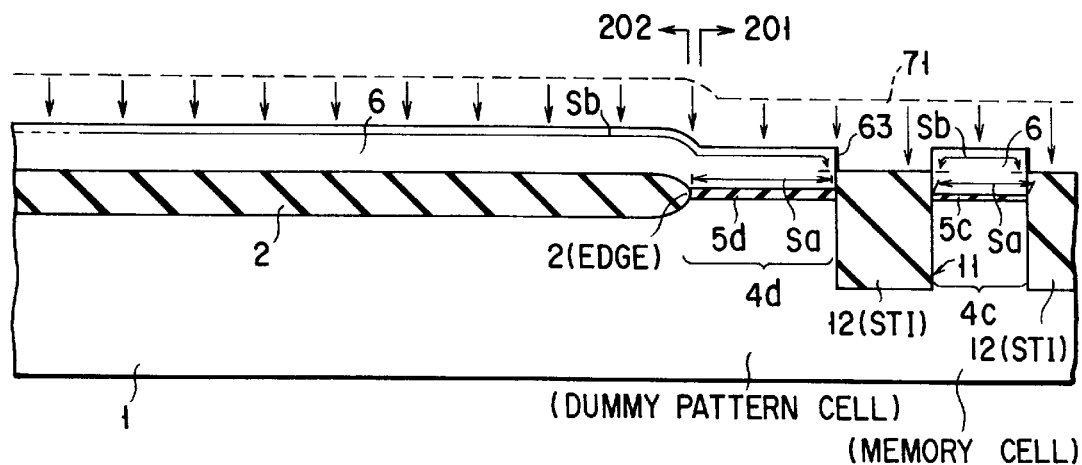
FIG. 23B is a cross sectional view taken along the line 23B—23B of the pattern shown in FIG. 23A.

With this structure, the first gate 6 can be formed of an independent pattern which is substantially the same size as the array section 201. Generally, the first gate layer is formed on the entire surface of the wafer. Therefore, the antenna ratio Sb/Sa can be set closer to "1" in comparison with a device having no loop-like form slit 64 as shown in FIGS. 23A and 23B.

Figure 24:
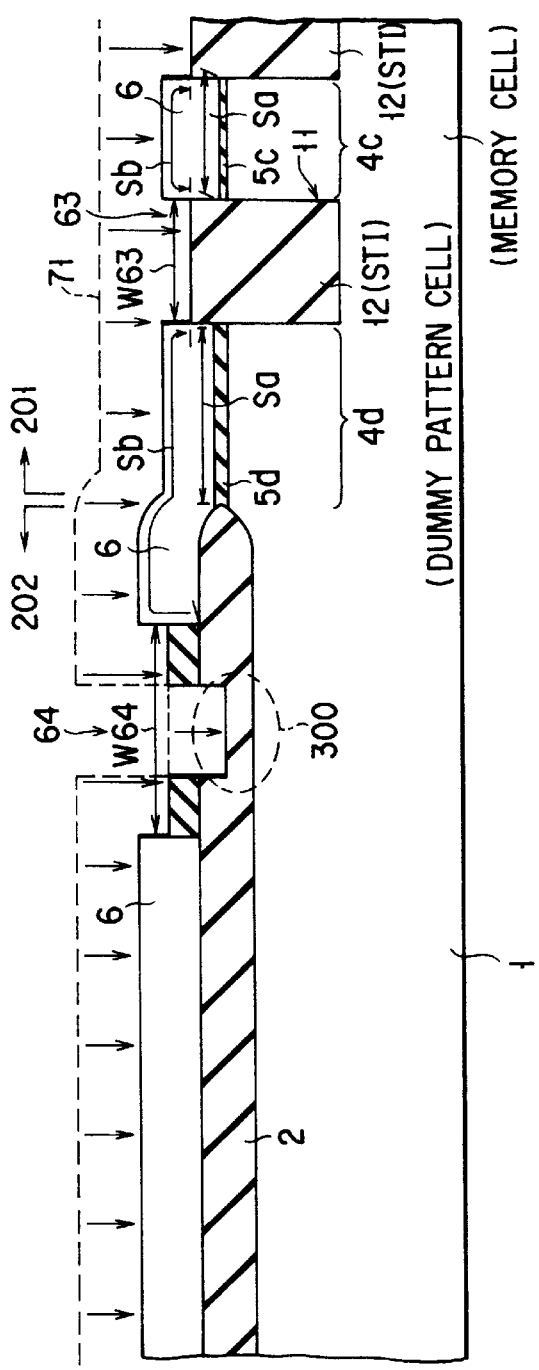
FIG. 24 is a cross sectional view showing an EEPROM, for illustrating a nonvolatile semiconductor memory device according to a ninth embodiment of this invention.

Next, a nonvolatile semiconductor memory device according to the ninth embodiment of this invention is explained. FIG. 24 is a cross sectional view of an EEPROM, for illustrating the background of this invention. As shown in FIG. 24, if the width W64 of a slit 64 in the circuit section 202 becomes wider than the width W63 of a slit 63 in the array section 201, the film thickness of a filling insulating material 71 of, for example, silicon dioxide in the slit 64 is made smaller than the film thickness of an insulating material in the slit 63. If, in this state, the insulating material 71 is etched back, a region 300 in which the LOCOS element isolation region 2 in the circuit section 202 is made thin may occur in some cases. The field inversion withstand voltage and gate breakdown voltage are extremely lowered in the region 300 in which the film thickness is reduced.

In order to solve the above problem, the width W64 of the slit 64 may be made substantially equal to the width W63 of the slit 63 as shown in FIG. 21 or the width W64 of the slit 64 may be made smaller than the width W63 of the slit 63 as shown in FIG. 19. With this structure, the film thickness of the filling insulating material 71 can be made substantially the same in the slits 63 and 64. Therefore, a reduction amount of the film at the etch-back time can be made substantially the same in the slits 63 and 64 and the film thickness of the element isolation region 2 in the circuit section 202 can be prevented from being reduced.

In the ninth embodiment, like the LOCOS element isolation region 2, the trench type isolation region 12 or the self-aligned trench element isolation region 12(ST1) can also be applied. This is because a reduction in the film thickness may cause the field inversion withstand voltage and gate breakdown voltage to be lowered in the trench type isolation or self-aligned trench element isolation.

Figure 25:
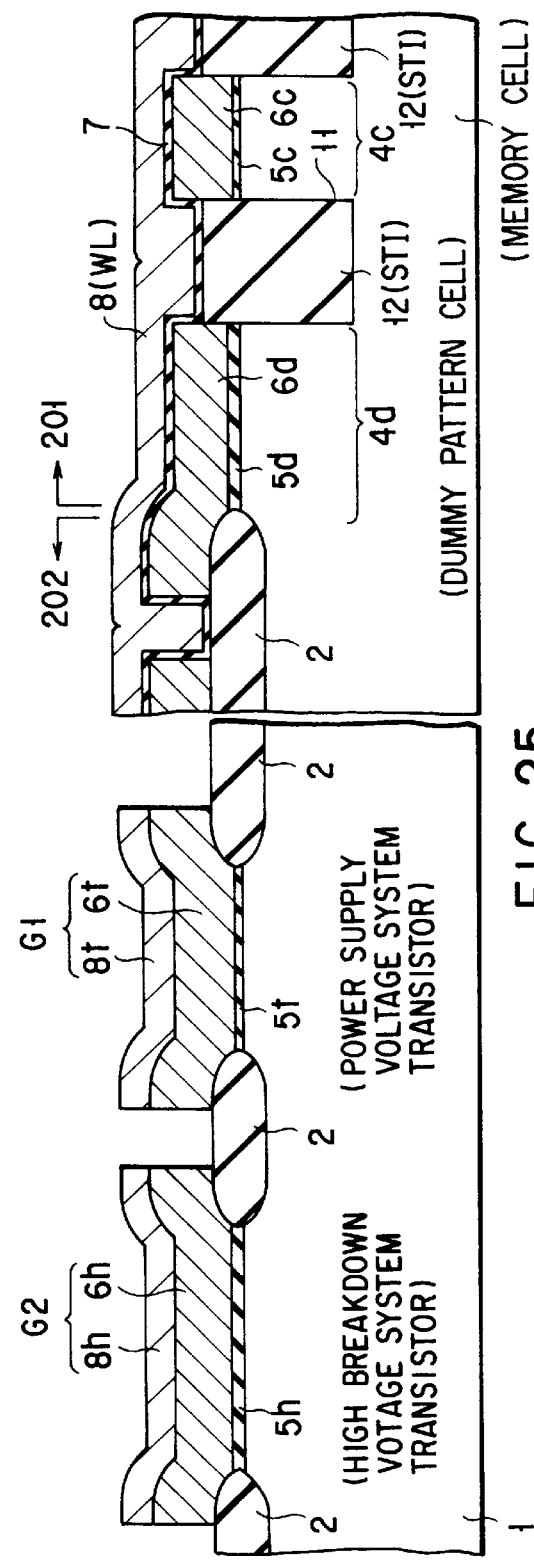
FIG. 25 is a cross sectional view showing an EEPROM, for illustrating a nonvolatile semiconductor memory device according to a tenth embodiment of this invention.

Next, a nonvolatile semiconductor memory device according to the tenth embodiment of this invention is explained. FIG. 25 is a cross sectional view of an EEPROM.

In a peripheral driving circuit section 202, various peripheral driving circuits for activating the storage function of an array section 201 are integrated. Transistors constituting the peripheral circuit include power supply voltage system transistors for producing a power supply voltage, for example, 5V supplied to a chip and high breakdown voltage system transistors for producing a voltage, for example, 20V higher than the power supply voltage. The high breakdown voltage transistor has a gate insulating film thicker than that of the power supply voltage system transistor to attain a sufficiently high breakdown voltage.

The thickest one of the gate insulating films formed in the EEPROM chip is the gate insulating film of the high breakdown voltage transistor and the thinnest one of the gate insulating films is a first gate insulating film 5c of the memory cell. Generally, the film thickness of the gate insulating film of the selection transistor formed in the array section 201 and the film thickness of the gate insulating film of the power supply voltage system transistor are set to values lying between them, but the film thicknesses of the gate insulating films of the selection transistor and the power supply voltage system transistor may be set to the same as the film thickness of the gate insulating film 5c in some cases. In the above EEPROM or a NOR type EEPROM having no selection transistor in the array section 201, the gate insulating film which is thicker than the gate insulating film of the memory cell is only the gate insulating film of the high breakdown voltage system transistor in the circuit section 202.

In the tenth embodiment, as shown in FIG. 25, the memory cells MC are formed inside the array section 201, the dummy pattern cells DPC are formed in the outermost portion thereof, and the power supply voltage system transistor and the high breakdown voltage system transistor are formed in the circuit section 202. In this case, the gate insulating film 5c of the memory cell MC is the thinnest film, the gate insulating film 5h of the high breakdown voltage system transistor is the thickest film and the gate insulating film 5t of the power supply voltage system transistor has an intermediate thickness. The thickness of the gate insulating film 5d of the dummy pattern cell DPC formed in the outermost portion in the array section 201 is made equal to the thickness of the gate insulating film 5h of the high breakdown voltage system transistor in the circuit section 202.

Gates G1, G2 of the transistors formed in the circuit section 202 shown in FIG. 25 are each formed of a two-layered structure of a first gate layer 6 and a second gate layer 8. That is, the gate electrode G1 of the power supply voltage system transistor has a stacked structure having a first-layered gate 6t and a second-layered gate 8t formed on the first-layered gate 6t. Likewise, the gate electrode G2 of the high breakdown voltage system transistor has a stacked structure having a first-layered gate 6h and a second-layered gate 8h formed on the first-layered gate 6h.

According to the tenth embodiment, by setting the thickness of the gate insulating film 5d of the dummy pattern cell DPC equal to the thickness of the gate insulating film 5h of the high breakdown voltage system transistor, the thickness of the gate insulating film 5d can be made larger than the thickness of the gate insulating film 5c of the memory cell MC. Therefore, the same effect as those of the first to ninth embodiments can be attained.

In addition, in the tenth embodiment, since the gate insulating film 5d of the dummy pattern cell DCP can be simultaneously formed at the time of formation of the gate insulating film of the high breakdown voltage system transistor even if the selection transistor is not formed in the array section 201 as in the NOR type EEPROM, the device can be formed without increasing the number of manufacturing steps.

A method for manufacturing the nonvolatile semiconductor memory device (EEPROM) according to the tenth embodiment is explained below.

First, a LOCOS element isolation region is formed in a forming region in which a circuit section 202 of a semiconductor substrate 1 is to be formed. Then, gate insulating films 5h, 5d are formed on the main surface portions of the substrate 1 in the circuit section 202 and array section 201. Next, parts of the gate insulating films 5h, 5d are selectively removed from a region of the circuit section 202 in which the power supply voltage system transistor is to be formed and a region of the array section 201 in which memory cells MC are to be formed. Then, a gate insulating film 5t thinner than the gate insulating film 5h is formed on the main surface of the substrate 1 in the region from which the gate insulating films 5h, 5d were removed. Next, part of the gate insulating film 5t is selectively removed from a region of the array section 201 in which the memory cells MC are to be formed. Then, a gate insulating film 5c thinner than the gate insulating film 5t is formed on the region from which the gate insulating film 5t was removed. After this, a first gate layer 6 is formed on the resultant semiconductor structure, a slit corresponding to the element isolation region in the array section 201 is formed in the first gate layer 6 and then trenches 11 are formed in the array section 201. Then, an insulating material is filled in the trenches 11 and etched back to form self-aligned trench type isolation regions 12(ST1).

Next, a second gate insulating film 7 is formed on the first gate layer 6. Then, part of the second gate insulating film 7 is removed from the circuit section 202. After this, a second gate layer 8 is formed on the entire surface of the resultant semiconductor structure and a photoresist film corresponding to a word line pattern and a gate electrode pattern in the circuit section 202 is formed on the second gate layer 8. Then, the second gate layer 8 and first gate layer 6 in the circuit section 202 and the second gate layer 8, second gate insulating film 7 and first gate layer 6 in the array section 201 are sequentially etched with the photoresist film used as a mask. Thus, gate electrodes G1, G2 are formed in the circuit section 202 and floating gates 6d, 6c and word lines 8(WL) are formed in the array section 201.

In this way, the EEPROM according to the tenth embodiment can be formed.

In the tenth embodiment described above, it is possible to set the thickness of the gate insulating film 5d of the dummy pattern cell DPC equal to the thickness of the gate insulating film 5t of the power supply voltage system transistor. In this case, the gate insulating film 5h is removed from the region of the circuit section 202 in which the power supply voltage system transistor is to be formed and the region of the array section 201 in which the dummy pattern cells are to be formed and the memory cells MC are to be formed. Then, the gate insulating films 5t, 5d thinner than the gate insulating film 5h are formed in a portion from which the gate insulating film 5h was removed. After this, the gate insulating films 5t, 5d are removed from a portion of the array section 201 in which the memory cells MC are to be formed. Then, a gate insulating film 5c thinner than the gate insulating film 5t is formed in the portion from which the gate insulating films 5t, 5d were removed.

In the tenth embodiment, the LOCOS element isolation region 2 is used for element isolation in the circuit section 202 and the self-aligned trench element isolation region 12(ST1) is used for element isolation in the array section 201, but it is possible to use the LOCOS element isolation region or the trench element isolation region for element isolation in both of the circuit section 202 and array section 201. Further, it is possible to use the LOCOS element isolation region for element isolation in the circuit section 202 and use the trench type element isolation region for element isolation in the array section 201.

This invention has been explained with reference to the first to tenth embodiments, but this invention is not limited to the first to tenth embodiments and, for example, this invention can be modified as follows.

For example, as the EEPROM, an AND type, DINOR type or ground array type EEPROM may be used in addition to the NAND type or NOR type if the capacitance between the floating gate and the control gate is different in the memory cell formed in the outermost portion of the memory cell array and in the memory cell formed in the inner portion. Further, the EEPROM is explained as the nonvolatile semiconductor memory device as an example, but an ultraviolet erasable EPROM, mask ROM, OTPROM having memory cells of the same structure can be used instead of the EEPROM.

Further, as the insulating material for filling the trench 11, BPSG, TEOS which is an insulating material of silicon oxide series can be used instead of silicon dioxide and another insulating material can be used. Likewise, the gate insulating films 5d, 5c, 5t, 5h can be formed of another insulating material such as silicon nitride ($Si_3N_4$), silicon oxide-nitride (SiON) other than silicon dioxide ($SiO_2$) and the second gate insulating film 7 can be formed of another insulating material such as silicon nitride ($Si_3N_4$), silicon oxide-nitride (SiON) other than ONO or silicon dioxide ($SiO_2$).

Further, as the conductive layer constituting the first gate layer 6, a conductive layer other than the amorphous silicon film or polysilicon film whose electric conductivity is enhanced by doping impurity can be used. Likewise, as the conductive layer constituting the second gate layer 8, a conductive layer of, for example, silicide of refractory metal represented by tungsten silicide other than the amorphous silicon film or polysilicon film whose electric conductivity is enhanced by doping impurity can be used. Further, a laminated structure (polycide structure) of polysilicon and silicide or a laminated structure (polymetal structure) of polysilicon and metal can be used instead of the second gate layer 8.

Further, this invention can be modified without departing form the technical scope thereof.

As described above, according to this invention, it is possible to provide a nonvolatile semiconductor memory device in which a lowering in the insulating characteristic between the control gate and the substrate can be suppressed and the reliability of the memory cells can be enhanced even if the pattern of cells in the outermost portion of the memory cell array section and the pattern of cells lying inside the pattern of the cells in the outermost portion are different from each other.

Further, it is possible to provide a method for manufacturing a nonvolatile semiconductor memory device in which a lowering in the insulating characteristic between the control gate and the substrate can be suppressed and the reliability of the memory cells can be enhanced even if the pattern of cells in the outermost portion of the memory cell array section and the pattern of cells lying inside the pattern of the cells in the outermost portion are different from each other.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A nonvolatile semiconductor memory device comprising:

a memory cell array section having memory cells which are arranged in a matrix form on a semiconductor substrate and each of which includes a charge storage layer coupled to the semiconductor substrate via a first capacitor having a first gate insulating film as a dielectric and a gate coupled to said charge storage layer via a second capacitor having a second gate insulating film as a dielectric, said memory cells including a first group of memory cells arranged in the outermost portion of said memory cell array section and a second group of memory cells arranged on the central side of said memory cell array section with respect to said first group of memory cells;

wherein the second capacitors of said first group of memory cells have different capacitances from the second capacitors of said second group of memory cells and the first gate insulating film of said first group of memory cells is formed thicker than the first gate insulating film of said second group of memory cells.

2. A nonvolatile semiconductor memory device according to claim 1, wherein said memory cells are arranged in substantially parallel linear active regions which are defined by element isolation regions formed in said memory cell array section, the memory cells of said first group and the memory cells of said second group commonly have word lines extending in a direction across the linear active regions as gates thereof, and the width of the active region in which the memory cells of said first group are arranged is larger than the width of the active region in which the memory cells of said second group are arranged when the second capacitors of the memory cells of said first group have larger capacitances than the second capacitors of the memory cells of said second group.

3. A nonvolatile semiconductor memory device according to claim 2, wherein the ratio (Ed/Ec) of a first electric (Ed) field applied to the first gate insulating film of said first group of memory cells to a second electric (Ec) field applied to the first gate insulating film of said second group of memory cells is not larger than 1 (Ed/Ec≦1).

4. A nonvolatile semiconductor memory device according to claim 3, wherein the ratio (Ed/Ec) of the first electric field (Ed) applied to the first gate insulating film of said first group of memory cells to the second electric field (Ec) applied to the first gate insulating film of said second group of memory cells is not smaller than 0.5 (Ed/Ec≧0.5).

5. A nonvolatile semiconductor memory device according to claim 1, which further comprises a peripheral driving circuit section provided adjacent to said memory cell array section, for driving said memory cell array section and in which a first element isolation region formed in said memory cell array section and a second element isolation region formed in said peripheral driving circuit section are selected from one of combinations of the first element isolation region of LOCOS type and the second element isolation region of LOCOS type; the first element isolation region of trench type and the second element isolation region of trench type; and the first element isolation region of LOCOS type and the second element isolation region of trench type.

6. A nonvolatile semiconductor memory device according to claim 5, wherein the element isolation region of trench type is a self-aligned trench element isolation region in which a trench is formed in self-alignment with said charge storage layer.

7. A nonvolatile semiconductor memory device according to claim 5, which further comprises electrical contacts formed for electrical connection between word lines and a circuit constituting said peripheral driving circuit section above the element isolation region of said peripheral driving circuit section and in which each of said electrical contacts is formed on a laminated structure of the word line, the second gate insulating film and a conductive layer formed of the same conductive material as the charge storage layers of said first and second groups of memory cells, and a separation distance between the conductive layer and the charge storage layer of said first group of memory cells is shorter than a separation distance between the charge storage layers in said memory cell array section.

8. A nonvolatile semiconductor memory device according to claim 5, wherein said peripheral driving circuit section includes a transistor for switching a voltage higher than a power supply voltage and the thickness of a gate insulating film of said transistor is substantially the same as the thickness of the first gate insulating film of the memory cells of said first group.

9. A nonvolatile semiconductor memory device according to claim 5, wherein said peripheral driving circuit section includes a transistor for switching a power supply voltage and the thickness of a gate insulating film of said transistor is substantially the same as the thickness of the first gate insulating film of the memory cells of said first group.

10. A nonvolatile semiconductor memory device according to claim 1, wherein said memory cell array section includes selection transistors and the thickness of a gate insulating film of said selection transistors is substantially the same as the thickness of the first gate insulating film of the memory cells of said first group.

11. A nonvolatile semiconductor memory device according to claim 1, wherein the memory cells of said first group are dummy pattern cells having no electrical contacts with bit lines.

12. A nonvolatile semiconductor memory device comprising:

a memory cell array section having memory cells which are arranged in a matrix form on a semiconductor substrate and each of which includes a charge storage layer coupled to the semiconductor substrate via a first capacitor having a first gate insulating film as a dielectric and a gate coupled to said charge storage layer via a second capacitor having a second gate insulating film as a dielectric, said memory cells being arranged in substantially parallel linear active regions which are defined by a first element isolation region formed in said memory cell array section, and said memory cells including a first group of memory cells arranged in the outermost portion of said memory cell array section and a second group of memory cells arranged on the central side of said memory cell array section with respect to said first group of memory cells; and a peripheral driving circuit section provided adjacent to said memory cell array section, for driving said memory cell array section;

wherein the following expression is satisfied:

$$1 \geq Ed/Ec = \frac{Tc + \frac{\varepsilon 1 \cdot Wc}{\varepsilon 2(Wc + 2Ww)} \cdot T2}{Td + \frac{\varepsilon 1 \cdot Wd}{\varepsilon 2(Wd + Ww + l)} \cdot T2}$$

when an electric field applied to the first gate insulating film of said first group of memory cells is Ed, an electric field applied to the first gate insulating film of said second group of memory cells is Ec, the thickness of the first gate insulating film of said first group of memory cells is Td, the thickness of the first gate insulating film of said second group of memory cells is Tc, the thickness of the second gate insulating film of said first and second groups of memory cells is T2, the dielectric constant of the first gate insulating film of said first and second groups of memory cells is $\varepsilon 1$, the dielectric constant of the second gate insulating film of said first and second groups of memory cells is $\varepsilon 2$, the width of the active region of said first group of memory cells is Wd, the width of the active region of said second group of memory cells is Wc, the width of a wing of said charge storage layer extending on the first element isolation region of the memory cell array section is Ww, and the length of a portion of said charge storage layer extending on a second element isolation region in said peripheral driving circuit section is l.

13. A nonvolatile semiconductor memory device according to claim 12, wherein the following expression is satisfied:

$$1 \geq Ed/Ec \geq 0.5$$

14. A nonvolatile semiconductor memory device according to claim 12, wherein the thickness of the first gate insulating film of said first group of memory cells is larger than the thickness of the first gate insulating film of said second group of memory cells.

15. A nonvolatile semiconductor memory device according to claim 12, wherein the width of the active region of said first group of memory cells (Wd) is larger than the width of the active region of said second group of memory cells (Wd).

16. A nonvolatile semiconductor memory device according to claim 12, wherein said peripheral driving circuit section includes a row decoder.

17. A nonvolatile semiconductor memory device according to claim 12, wherein the first element isolation region formed in said memory cell array section and the second element isolation region formed in said peripheral driving circuit section are selected from one of combinations of the first element isolation region of LOCOS type and the second element isolation region of LOCOS type; the first element isolation region of trench type and the second element isolation region of trench type; and the first element isolation region of LOCOS type and the second element isolation region of trench type.

* * * * *